United States Patent
Koga et al.

(10) Patent No.: US 8,225,243 B2
(45) Date of Patent: Jul. 17, 2012

(54) DEVELOPMENT METHOD FOR INTEGRATED CIRCUITS, PROGRAM STORAGE MEDIUM FOR STORING THE DEVELOPMENT METHOD FOR INTEGRATED CIRCUITS, AND CONCURRENT DEVELOPMENT SYSTEM, DEVELOPMENT PROGRAM, AND DEVELOPMENT METHOD OF ASIC AND PROGRAMMABLE LOGIC DEVICE

(75) Inventors: Chiaki Koga, Yokohama (JP); Masayuki Tsuda, Yokohama (JP); Akitsugu Nakayama, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 238 days.

(21) Appl. No.: 12/591,356

(22) Filed: Nov. 17, 2009

(65) Prior Publication Data
US 2010/0070943 A1   Mar. 18, 2010

Related U.S. Application Data

(60) Division of application No. 11/636,606, filed on Dec. 11, 2006, now Pat. No. 7,647,575, which is a division of application No. 10/965,850, filed on Oct. 18, 2004, now Pat. No. 7,219,311, which is a continuation of application No. PCT/JP03/04787, filed on Apr. 15, 2003.

(30) Foreign Application Priority Data

Apr. 17, 2002 (JP) .................................. 2002-115273
May 22, 2002 (JP) .................................. 2002-147930

(51) Int. Cl.
*G06F 17/50* (2006.01)

(52) U.S. Cl. ........ 716/101; 716/103; 716/104; 716/116; 716/117

(58) Field of Classification Search .......... 716/100–104, 716/116–117, 121, 128
See application file for complete search history.

(56) References Cited

U.S. PATENT DOCUMENTS
5,867,399 A    2/1999   Rostoker et al.
(Continued)

FOREIGN PATENT DOCUMENTS
CN    1637593 A    7/2005
(Continued)

OTHER PUBLICATIONS

Koga et al., "Mega Gate ASIC No Implement Sekkei", Institute of Electronics, Information and Communication Engineers Gijutsu Kenkyu Kokoku, Institute of Electronics, Information and Communication Engineers, Sep. 22, 1998, vol. 98, No. 287, pp. 71-77.

(Continued)

*Primary Examiner* — Paul Dinh
(74) *Attorney, Agent, or Firm* — Staas & Halsey LLP

(57) ABSTRACT

A method for developing integrated circuits includes generating a core (logic core) in an HDL format readable by a logic synthesis tool, from an ASIC core (logic core) made of ports of blocks and port connection information, creating a temporary chip design from chip terminal information to generate a terminal in the temporary chip design, generating a design identical to that created, as a cell within the design created, connecting a design port with a cell port, wherein a name of the design port is identical to a name of the cell port, inserting an I/O buffer, depending on the device technology, into a net between the ports connected, replacing the cell by the core (logic core) created to gerate a netlist, and expanding a hierarchy of the design, being the top hierarchy.

5 Claims, 37 Drawing Sheets

U.S. PATENT DOCUMENTS

| | | | |
|---|---|---|---|
| 6,237,132 | B1 | 5/2001 | Dean et al. |
| 6,701,504 | B2 | 3/2004 | Chang et al. |
| 6,976,239 | B1 | 12/2005 | Allen et al. |
| 7,013,438 | B1 | 3/2006 | Saldanha et al. |
| 7,275,232 | B2 | 9/2007 | Schleicher, II et al. |
| 2004/0128626 | A1 | 7/2004 | Wingren et al. |
| 2005/0149898 | A1* | 7/2005 | Hakewill et al. ............... 716/18 |
| 2005/0278682 | A1 | 12/2005 | Dowling |
| 2007/0294659 | A1 | 12/2007 | Schleicher, II et al. |

FOREIGN PATENT DOCUMENTS

| | | |
|---|---|---|
| JP | 8-194725 | 7/1996 |
| JP | 2000-90142 | 3/2000 |

OTHER PUBLICATIONS

Xie Chang-sheng, et al., "The Application of FPGA Devices in ASIC Design", Microelectronics, vol. 29, No. 6, pp. 50-52.

U.S. Appl. No. 11/636,606, filed Dec. 11, 2006, Chiaki Koga et al., Fujitsu Limited.

U.S. Appl. No. 11/636,607, filed Dec. 11, 2006, Chiaki Koga et al., Fujitsu Limited.

Office Action mailed from the U.S. Patent and Trademark Office on Aug. 17, 2006 in the related U.S. Appl. No. 10/965,850.

Notice of Allowance mailed from the U.S. Patent and Trademark Office on Jan. 3, 2007 in the related U.S. Appl. No. 10/965,850.

Communication from the Chinese Patent Office issued on Dec. 26, 2008 in a related Chinese application.

Office Action mailed from the U.S. Patent and Trademark Office on Mar. 24, 2009 in the related U.S. Appl. No. 11/636,606.

Office Action mailed from the U.S. Patent and Trademark Office on Apr. 1, 2009 in the related U.S. Appl. No. 11/636,607.

Notice of Allowance mailed from the U.S. Patent and Trademark Office on Sep. 4, 2009 in the related U.S. Appl. No. 11/636,606.

Notice of Allowance mailed from the U.S. Patent and Trademark Office on Sep. 25, 2009 in the related U.S. Appl. No. 11/636,607.

* cited by examiner

FIG.17

LOGIN TO SYSTEM

Name

Password

Login

FIG.30

| PACKAGE NAME | NUMBER OF IO | GATE SIZE | COMPATIBLE PACKAGE |
|---|---|---|---|
| PACKAGE NAME | XXX | GGGGG | ABCDEFG,YYYYYYY,... |
| ............ | .... | ........... | ............ ,... |

FIG.32

| PROJECT NAME | |
|---|---|
| TARGET LOGIC CORE | |
| BLOCK NAME | |
| FPGA NUMBER | |

◇ PRIORITY GIVEN TO AREA          ◇ PRIORITY GIVEN TO SPEED
◇ Debug                                          ◇ Fix

EXECUTE

FIG.34

| PROJECT NAME | :XXX | | |
|---|---|---|---|
| FPGA NUMBER | :1 | 2 | 3 ... |
| PACKAGE NAME | :XXX | XXX | XXX |
| SYNTHESIS SIZE | :XXX | YYY | ZZZ |
| CELL USAGE RATE | :50 | 70 | 75 |

FIG.35

| FPGA No. | FPGA NAME | | |
|---|---|---|---|
| 1. | AAAAA | INPUT CONDITION DATA | EXECUTE |
| 2. | BBBBB | INPUT CONDITION DATA | EXECUTE |
| 3. | CCCCC | INPUT CONDITION DATA | EXECUTE |
| ... | ...... | ............ | ..... |
| ... | ...... | ............ | ..... |

FIG.36

| PROJECT NAME : XXXX | | |
|---|---|---|
| No. | FPGA NAME | DATE |
| 1 | AAAA | yyyy/mm/dd |
| 2 | BBBB | ■ ■ ■ ■ ■ ■ ■ ■ |
| 3 | ■ ■ ■ ■ ■ | ■ ■ ■ ■ ■ ■ ■ ■ |
| ■ ■ | | |

FIG.37

```
PROJECT NAME: XXXXXX
              SCHEDULED DATE   RESULT DATE

1st RTL     yyyy/mm/dd1     yyyy/mm/dd2
               ■■■■■■■■■■■■■■■■■
               ■■■■■■■■■■■■■■■■■
   REFLECTION
   STARTING DATE yyyy/mm/dd3   yyyy/mm/dd3    [LOGIC FIX] [CHANGE]
   REFLECTION
   STARTING DATE yyyy/mm/dd4                    yyyy/mm2/dd Sign Off    yyyy/mm1/dd
```

FIG.38

| BLOCK NAME | TIME REQUIRED |
|---|---|
| Block1 | 1h |
| Block2 | 5h |
| ■■■■■■■■■ | ■■■■■■■■■ |
| ■■■■■■■■■ | ■■■■■■■■■ |

DEVELOPMENT METHOD FOR INTEGRATED CIRCUITS, PROGRAM STORAGE MEDIUM FOR STORING THE DEVELOPMENT METHOD FOR INTEGRATED CIRCUITS, AND CONCURRENT DEVELOPMENT SYSTEM, DEVELOPMENT PROGRAM, AND DEVELOPMENT METHOD OF ASIC AND PROGRAMMABLE LOGIC DEVICE

CROSS-REFERENCE TO RELATED APPLICATIONS

This application is a divisional of application Ser. No. 11/636,606, filed Dec. 11, 2006 now U.S. Pat. No. 7,647,575, and now allowed, which is related to concurrently filed application Ser. No. 11/636,607, filed Dec. 11, 2006, and now allowed, both of which are divisionals of application Ser. No. 10/965,850, filed Oct. 18, 2004, and now U.S. Pat. No. 7,219,311, which is a continuing application, filed under 35 U.S.C. §111(a), of International Application PCT/JP03/04787, filed Apr. 15, 2003, which further claims the benefit of priority Japanese Patent Application Nos. 2002-115273, filed Apr. 17, 2002 and 2002-147930, filed May 22, 2002, the contents of which are incorporated herein by reference.

TECHNICAL FIELD

The present invention relates to a programmable logic device forming method for development of integrated circuits, and a development method for developing integrated circuits, a program storage medium for storing the development method for integrated circuits, a controller for a logic synthesis tool, a concurrent development system, a concurrent development program, and a concurrent development method for concurrent development of the ASIC and the programmable logic device, which enable seamless and concurrent development of the ASIC and the programmable logic device, ensure the design quality while reducing the development period, human resources, and development cost.

BACKGROUND ART

In the manufacturing procedure of integrated circuits, the specifications are determined, and designing is performed according to the specification, after having examined carefully if anything has been overlooked. FIG. 11 is a flowchart of the procedure for designing integrated circuits. First, the specification of an Application Specific Integrated Circuit (ASIC) is obtained from the product specification (step g1). Circuit architecture is then studied (step g2). Circuit designing is then performed based on the study of the circuit architecture (step g3). This circuit designing is performed while performing logic verification (step g4).

After circuit designing, logic synthesis of the circuit is performed (step g5). Next, layout expansion is performed based on the logic synthesis (step g6). At this stage, the circuit design is complete. When the circuit is designed, the circuit is manufactured (step g7), and a real machine is evaluated by using the produced circuit (step g8). In the above sequence, the present invention is related to the logic synthesis at step g5.

In the development of integrated circuits, a circuit architecture study for studying a function to be realized using the specification as an input, and studying the circuit configuration for realizing the function is executed in the following flow. Normally, in the development of the integrated circuits, functions for realizing a product are extracted without omission from the product specification, and a study of a circuit configuration for realizing the dug up functions and a macro study such as Intellectual Property (IP) are executed. Macro here refers to the one including the IP that can be used without changing a RAM, a ROM, or the like.

Initial estimate for a circuit for which the configuration has been studied, and the size of the IP to be realized is performed, by calculating the number of gates if known at this stage, and if the number of gates is not known, the number of flip-flops is calculated from the required number of signals and the time required for the processing, to estimate the size to be realized. A plurality of functions is grouped to form one block, based on the estimated size and the number of input/output signals (hereinafter, "ports") for the respective functions. This grouping is performed for all functions.

In the logic design, a circuit is designed for a programmable logic device by a means such as Hardware Description Language (HDL) based on the functions and the estimated size, to perform on-board function evaluation. After having finished the evaluation, redesign and reevaluation are performed at the time of forming the ASIC.

After completion of the function evaluation, when cost reduction is realized by forming the ASIC, designing taking the ASIC into consideration is not normally performed at the time of designing the programmable logic device (for example, FPGA). Therefore, redesign is required for the ASIC based on the design data of the programmable logic device, due to differences between the ASIC and the programmable logic device, like a macro such as an I/O buffer, a device test circuit, and a memory. This results in problems such as double management of design data due to redesign, prolonged development period and an increase in the development cost due to redesign and reevaluation of functions.

The ASIC has a feature of prolonged development period but low cost, and in contrast, the programmable logic device (FPGA) has a feature of short development period but high cost.

The present invention has been made in consideration of the above problems, and it is an object of the present invention to provide a development method of integrated circuits, to which a method of creating a netlist between blocks as port connection information from port information of blocks obtained by functionally dividing a chip and port information of the chips (disclosed in Japanese Patent Application Laid-Open No. 2000-90142) is applied, in the circuit architecture study applied for logic design, logic synthesis, and concurrent (parallel) development of a layout in the development of a large-scale ASIC, and an apparatus that controls a logic synthesis tool so that blocks constituting the integrated circuit to be developed by the development method of the integrated circuits and a net between blocks are formed in an optional size and optional number from the netlist between blocks. It is further an object of the present invention to realize a common architecture, and provide a development method of integrated circuits that can avoid redesign and re-verification as much as possible, and a program storage medium for storing the development method of the integrated circuits.

Recently, even an ASIC with 10M gates or more have been developed by microfabrication of a semiconductor. However, with the electronic equipment becoming high-function and complicated, implementation design for performing specification design, logic design, floor plan, logic synthesis, layout design, and timing verification requires long time and it becomes difficult to ensure the design quality. Particularly, remake of the ASIC development not only extends the development period of electronic equipment, but also increases cost and a loss of market investment opportunity.

Therefore, a programmable logic device having a short development turn around time (TAT) and an easy-to-change design is used in many occasions, but the programmable logic device is expensive, and its downsizing is difficult. Accordingly, in many occasions, functions are realized first by the programmable logic device, and after debugging by prototyping, the ASICs are formed at the time of mass-production.

However, even if verification is performed by prototyping of the programmable logic device with the assumption of forming the ASIC, there is a problem in the serial development from the programmable logic device to the ASIC in that it is difficult to shorten the entire development process. Particularly, when a timing problem occurs in the implementation design at the time of developing the ASIC, there is the possibility that redesign of the programmable logic device must be performed again. Consigning the design to outside the company, such as a semiconductor vendor, causes an increase in the cost as well as in human resources in the consignee.

Further, when redesign takes place exclusively in the ASIC due to a difference in the structure between the programmable logic device and the ASIC device, not only does debugging by the programmable logic device become meaningless, but also the development period is prolonged to thereby cause a cost increase. In either case, it causes a loss of market investment opportunity.

As a measure against the prolonged development period accompanying a large scale ASIC, as disclosed in Japanese Patent Application Laid-Open No. 2000-90142, circuit architecture study, logic design and verification, and implementation design are concurrently performed. However, specification design, logic design and verification are prolonged due to complicated functions of the electronic equipment and fast market movement, and hence it becomes difficult to shorten the development process. Further, when the development is executed concurrently, human resources having the knowledge of ASIC development and a development tool are necessary, thereby causing a problem in that training about the development tool, which becomes complicated with the progress of the semiconductor technology, becomes necessary.

Therefore, it is also an object of the present invention to provide a concurrent development system, a concurrent development program, and a concurrent development method of the ASIC and the programmable logic device, which enable seamless and concurrent development of the ASIC and the programmable logic device, ensure the design quality while reducing the development period, and can reduce human resources and cost required for the development.

DISCLOSURE OF THE INVENTION

A program storage medium that stores a development method for developing integrated circuits, the development method includes a core generating including generating a core (logic core) in an HDL format readable by a logic synthesis tool, from an ASIC core (logic core) made of ports of blocks and port connection information, by a unit that selects optional blocks having a connection to group the blocks, wherein the core (logic core) includes ports of blocks of optional size and number and port connection information, creating a temporary chip design from chip terminal information by using the logic synthesis tool to generate a terminal in the temporary chip design, a design generating including generating a design identical to that created at the creating, as a cell within the design created, connecting a design port with a cell port, wherein a name of the design port is identical to a name of the cell port, inserting an I/O buffer, depending on the device technology, into a net between the ports connected, and a netlist generating/expanding including generating a netlist by replacing the cell by the core (logic core) created at the core generating, and expanding a hierarchy of the design, being the top hierarchy.

According to one aspect of the present invention, a computer readable recording medium for storing a program for making a computer execute a method is provided, wherein an entity, being a port specification of a block is created from a port name, range, and input/output definition, and output to a file (written in a file). It is then checked whether there is no mistake in an output port name of an instance on the output side specified as an input port of a certain block by a unit that creates an output signal file relating to a port defined as output by the input/output definition. When there is a definition of keyword in the instance name on the output side, such as I/O indicating connection with a terminal of a device package, an entity, being a port specification of a core (logic core), is created and written in a file, by a unit that determines whether the terminal is one or multiple (vector) from the range definition, a unit that determines whether the terminal is for an input or an output from the input/output definition, and a unit that determines whether the terminal is a two-way terminal from the type definition, by designating a name in the output port name of the instance on the output side as a terminal name of the device package. The "instance" here stands for a circuit unit.

When a port of the block is defined as input by the input/output definition, it is checked whether there is a set of the instance name on the port output side and an output port name of the instance on the output side in the output signal file. When it is determined that connection of ports between the instances is possible, a signal for connecting the instances is created, and written in the file. When the process including the check of all instances has finished, the entity of the core (logic core) and the net between the instances are read, to create a core (logic core), which is then written in the file.

If there is no problem in the check result, an HDL file (hereinafter, "core (logic core)") that includes the input/output port specification of the block, the connection net between the instances, and a connection net between the instances and external terminals, being terminals of the device package, and does not have a logic design part at all, is output.

According to the above aspect, in a program storage medium that stores a program for making a computer execute a method of generating a core (logic core), the quality of port specification of a block, being an input in the RTL design, is ensured beforehand in the integrated circuit development. Further, in a large-scale integrated circuit having many functional blocks and design resources, because connection between blocks can be confirmed beforehand, it can be ensured that a chip is assembled without fail.

According to another aspect of the present invention, a development method for developing integrated circuits, to be used when concurrent development of an ASIC and a programmable logic device is conducted, includes a core generating including generating a core (logic core) including ports of blocks of optional size and number and port connection information, from a netlist referred to as an ASIC core (logic core) made of ports of blocks and port connection information, by a unit that selects optional blocks having a connection to group the blocks, creating a temporary chip design from chip terminal information by using a logic synthesis tool, a terminal generating including generating a terminal, with a name existing in the chip terminal information, in the temporary chip design, a design generating including generating a design identical to that created at the creating, as a cell within the design created, connecting a design port with a cell port, wherein a name of the design port is identical to a name of the cell port, inserting an I/O buffer, depending on the device technology, from the chip terminal information into a connection net, replacing the cell by the core (logic core) created at the core generating, and a chip netlist generating including generating a chip netlist by expanding a hierarchy of the design created at the creating, being the top hierarchy of the core (logic core).

The invention according to the above aspect is a development method of integrated circuits wherein in the concurrent development of the ASIC and the programmable logic device, the method includes steps of controlling functions of a logic synthesis tool by a controller in which a program storage medium that stores a program for making a computer execute a netlist creation method according to claims 3 and 4 is loaded, from the core (logic core) of the ASIC according to claim 1, grouping optional blocks having a connection, cutting the grouped blocks as a core (logic core) of the programmable logic device, and inserting an I/O buffer depending on the programmable logic device, to create a netlist of chips for the programmable logic device.

According to the above aspect, a core (logic core) of the programmable logic device is allocated from the ASIC core (logic core), while maintaining connection between blocks. Therefore, if verification of the programmable logic device using the core (logic core) is performed, duplication of verification at least in the same configuration can be avoided in the ASIC. Thus, concurrent development of the ASIC and the programmable logic device can proceed efficiently.

When inserting the I/O buffer, the chip port information defined in the block and the chip terminal information can be cross-checked by a unit that generates a temporary core (logic core) from the chip terminal information, and replaces it by a core (logic core) generated from the block, thereby ensuring the quality of the port specification of the block and the chip terminal specification.

According to still another aspect of the present invention, the program storage medium according to claim 1, wherein in the development method, the core generating further includes creating a netlist, including ports of blocks of optional size and number and port connection information, from the ASIC core (logic core) made of ports of blocks and port connection information, by the unit that selects the optional blocks having the connection to group the blocks.

As a result, a netlist including ports of blocks of optional size and number and port connection information can be created.

According to still another aspect of the present invention, in a program storage medium that records a development method for developing integrated circuits, the development method includes a core generating including generating a core (logic core) including ports of blocks of optional size and number and port connection information, from an ASIC core (logic core) made of ports of blocks and port connection information, by a unit that selects optional blocks having a connection to group the blocks, creating a temporary chip design from chip terminal information by using a logic synthesis tool to generate a terminal, with a name existing in the chip terminal information, in the temporary chip design, a design generating including generating a design identical to that created at the creating, as a cell within the design created, connecting a design port with a cell port, wherein a name of the design port is identical to a name of the cell port, inserting an I/O buffer, depending on the device technology, from the chip terminal information into a connection net, replacing the cell by the core (logic core) created at the core generating, and a chip netlist generating including generating a chip netlist by expanding a hierarchy of the design created at the creating, being the top hierarchy of the core (logic core).

As a result, a chip netlist can be created from the netlist including ports of blocks of optional size and number and port connection information.

According to still another aspect of the present invention, in the development method of integrated circuits, when a netlist including ports of blocks of optional size and number and port connection information is created, a port name in the top hierarchy, being a net name, is corrected to match with a port name of a block to be connected, thereby creating a netlist made of ports of blocks and port connection information.

The invention according to the above aspect is a control method of a logic synthesis tool, wherein in the concurrent development of the ASIC and the programmable logic device, when optional blocks having a connection are grouped from the core (logic core) of the ASIC including the block ports and connection information of the ports, and are cut as the core (logic core) of the programmable logic device by using the function of the logic synthesis tool, the port name at the top of the cut core (logic core) is normally a name of a net connected to the port, the net is traced from the port to the inside of the core (logic core) by controlling the function of the logic synthesis tool, which replaces the port name of the first found block.

According to the above aspect, in a recording medium that stores a program for making a logic synthesis tool execute a method of generating a core (logic core) of the programmable logic device, a decrease in efficiency of debugging such as logic verification can be prevented when a net name, from which it is difficult to determine the function of a port, becomes a port name.

Thus, the circuit architecture can be shared by generating a core (logic core) from the design document data and newly generating a core (logic core) for the programmable logic device from the core (logic core), with the hierarchical structure and the connection information being preserved. The circuit data and the net between instances, which do not depend on the device technology in the instance in which circuit data is inserted therein and function verification has been performed, can avoid re-verification when the ASIC is formed. Further, this avoids redesigning due to a difference between the ASIC and the programmable logic device.

Further, the invention according to still another aspect of the present invention is a controller for a logic synthesis tool that controls the generation of a core (logic core) of a programmable logic device including ports of blocks formed of selected blocks and port connection information, by selecting optional blocks constituting an ASIC from the core (logic core) of the ASIC including ports of blocks and port connection information, and grouping the selected blocks. The controller includes a unit that performs control for changing a net name given as a port name by the logic synthesis tool with respect to a port of the core (logic core) of the programmable logic device formed of blocks created by the logic synthesis tool and selected by a designer, into a port name of blocks constituting the connected programmable logic device by tracing the net connected to the port, a unit that creates a temporary chip design having the port designated by the chip terminal information by the logic synthesis tool, a unit that generates the temporary chip design as a cell in the design, a unit that connects the temporary chip design with ports having the same name between cells, inserts an I/O buffer depending on the device technology from the chip terminal information into the connected net, and replaces by a cell the core (logic core) of the programmable logic device formed of blocks created by the logic synthesis tool and selected by the designer, whose name has been changed, and a unit that creates a netlist of chips for the programmable logic device by expanding the top hierarchy of the core (logic core).

With such a configuration, the netlist of chips for the programmable logic device can be created.

According to the present invention, a concurrent development method for concurrent development of an ASIC and a programmable logic device includes grouping/creating including grouping functional blocks constituting the ASIC based on port connection information, and creating a netlist, including ports of the functional blocks grouped and the port connection information, as a core (logic core) of the programmable logic device, a logic synthesis data creating including creating logic synthesis data for the ASIC and logic synthesis data for the programmable logic device from circuit data of the functional blocks constituting the ASIC, a ROM data creating including creating ROM data by inserting the logic synthesis data for the programmable logic device relating to the functional blocks grouped, into the netlist created at the grouping/creating, wherein the ROM data is used for evaluating real machines in which a circuit of the programmable logic device is recorded, performing ASIC layout creation and timing verification concurrently with the ROM data creating, using the logic synthesis data for the ASIC created, and a difference reflecting including reflecting a change in the circuit data during the performing, based on a result of evaluating the real machine using the ROM data created.

According to the present invention, a computer program for concurrent development of an ASIC and a programmable logic device, makes a computer execute grouping/creating including grouping functional blocks constituting the ASIC based on port connection information, and creating a netlist, including ports of the functional blocks grouped and the port connection information, as a core (logic core) of the programmable logic device, a logic synthesis data creating including creating logic synthesis data for the ASIC and logic synthesis data for the programmable logic device from circuit data of the functional blocks constituting the ASIC, a ROM data creating including creating ROM data by inserting the logic synthesis data for the programmable logic device relating to the functional blocks grouped, into the netlist created at the grouping/creating, wherein the ROM data is used for evaluating real machines in which a circuit of the programmable logic device is recorded, performing ASIC layout creation and timing verification concurrently with the ROM data creating, using the logic synthesis data for the ASIC created, and a difference reflecting including reflecting a change in the circuit data during the performing, based on a result of evaluating the real machine using the ROM data created.

According to the present invention, the functional blocks constituting the ASIC are grouped based on the port connection information, and a netlist including the ports of the grouped functional blocks and the port connection information is created as a core (logic core) of the programmable logic device. The ASIC logic synthesis data and the logic synthesis data for the programmable logic device are created from the circuit data of the functional blocks constituting the ASIC. The logic synthesis data for the programmable logic device relating to the grouped functional blocks is inserted in the created netlist to create ROM data for evaluating the real machine in which the circuit of the programmable logic device is recorded. Layout creation of the ASIC and the timing verification are performed concurrently with creation of the ROM data for evaluating the real machine using the created logic synthesis data for the ASIC. A change in the circuit data based on the evaluation result of the real machine using the created ROM data is reflected in creation of ASIC layout and timing verification. Consequently, efficient concurrent development of the ASIC and the programmable logic device becomes efficient, thereby reducing the development period of the ASIC.

According to the present invention, a concurrent development system for concurrent development of an ASIC and a programmable logic device includes a netlist creating unit that creates a netlist, including ports of the functional blocks grouped and the port connection information, as a core (logic core) of the programmable logic device, by grouping functional blocks constituting the ASIC based on port connection information, a logic synthesis data creating unit that creates logic synthesis data for the ASIC and logic synthesis data for the programmable logic device from circuit data of the functional blocks constituting the ASIC, a ROM data creating unit that creates ROM data by inserting the logic synthesis data for the programmable logic device relating to the functional blocks grouped, into the netlist created at the grouping/creating, wherein the ROM data is used for evaluating real machines in which a circuit of the programmable logic device is recorded, and an ASIC layout creating unit that performs ASIC layout creation and timing verification concurrently with the ROM data creating, using the logic synthesis data for the ASIC created.

According to the present invention, the functional blocks constituting the ASIC are grouped based on the port connection information, and a netlist including the ports of the grouped functional blocks and the port connection information is created as a core (logic core) of the programmable logic device. The ASIC logic synthesis data and the logic synthesis data for the programmable logic device are created from the circuit data of the functional blocks constituting the ASIC. The logic synthesis data for the programmable logic device relating to the grouped functional blocks is inserted in the created netlist to create ROM data for evaluating the real machine in which the circuit of the programmable logic device is recorded. Layout creation of the ASIC and the timing verification are performed concurrently with creation of the ROM data for evaluating the real machine using the created logic synthesis data for the ASIC. Consequently, concurrent development of the ASIC and the programmable logic device becomes efficient, thereby reducing the development period of the ASIC.

According to the present invention, a concurrent development system for concurrent development of an ASIC and a programmable logic device used by a user from a computer connected to a network includes an ASIC logic synthesis unit that executes logic synthesis of the ASIC in response to a request from the user, to obtain a first logic synthesis result, an ASIC logic synthesis result determining unit that determines whether the first logic synthesis result satisfies a speed performance required by the user, to obtain a determination result, a programmable logic device logic synthesis unit that executes logic synthesis of the programmable logic device, based on the determination result to obtain a second logic synthesis result, a logic synthesis result displaying unit that displays the first logic synthesis result and the second logic synthesis result on the computer, and a logic synthesis informing unit that informs the user by an e-mail, of start of the logic synthesis of the ASIC and the first logic synthesis result, and of start of the logic synthesis of the programmable logic device and the second logic synthesis result.

According to the present invention, a concurrent development method for concurrent development of an ASIC and a programmable logic device used by a user from a computer connected to a network includes a first executing including executing logic synthesis of the ASIC in response to a request from the user, to obtain a first logic synthesis result, determining whether the first logic synthesis result satisfies a speed performance required by the user, to obtain a determination result, a second executing including executing logic synthesis of the programmable logic device, based on the determination result to obtain a second logic synthesis result, displaying the first logic synthesis result and the second logic synthesis result on the computer, and informing the user by an e-mail, of start of the first executing and the first logic synthesis result, and of start of the second executing and the second logic synthesis result.

According to the present invention, logic synthesis of the ASIC is executed in response to a user's request, it is determined whether the logic synthesis result of the formed ASIC satisfies the speed performance requested by the user. Logic synthesis of the programmable logic device is executed based on the determination result. The execution result of logic synthesis of the ASIC and the execution result of logic synthesis of the programmable logic device are displayed on a computer, and an e-mail informing execution start and execution result of logic synthesis of the ASIC, and execution start and execution result of logic synthesis of the programmable logic device is sent to the user. Consequently, the user can execute logic synthesis at any time without providing an exclusive operator for the logic synthesis, can maintain uniform logic synthesis quality as if the logic synthesis is performed by the exclusive operator, and can receive information of start and result of the logic synthesis by the e-mail, thereby eliminating the necessity of regularly confirming the progress of logic synthesis by a computer.

According to the present invention, the concurrent development system for concurrent development of an ASIC and a programmable logic device according to the invention, further includes a netlist creating unit that creates a netlist including port connection information of a plurality of functional blocks specified by the user, from functional blocks constituting the ASIC, in response to a request of the user, a ROM data creating unit that creates ROM data, in which a circuit of the programmable logic device is recorded, by inserting the data of the logic synthesized target functional block into the netlist created by the netlist creating unit, a ROM data creation result display unit that displays a result of the creation of the ROM data, on the computer, and a ROM data creation result informing unit that informs the user by an e-mail, of the result of creation of the ROM data.

According to the present invention, a netlist including the port connection information of a plurality of functional blocks specified by a user from the functional blocks constituting the ASIC is created in response to a user's request. ROM data in which a programmable logic device circuit is recorded is generated by inserting data of the logic synthesized functional block in the created netlist, and the generation result of the generated ROM data is displayed on a computer, and informed to the user by an e-mail. Consequently, the user can save load, time and cost required for generating the ROM data in which the programmable logic device circuit is recorded, without providing a development environment exclusively for the programmable logic device.

According to the present invention, the concurrent development system for concurrent development of an ASIC and a programmable logic device according to the above aspect, further includes a temporary netlist creating unit that creates a netlist in which a dummy circuit is inserted in an input terminal and an output terminal of the functional block constituting the ASIC specified by the user, when designing of the functional block has not been completed, and when there is no circuit data.

According to the present invention, when designing of the functional block constituting the ASIC specified by a user has not yet been completed and there is no circuit data, a netlist with a circuit in which a temporary flip-flop or the like is used for the input and output terminals of the functional block inserted therein is created. Consequently, in the verification by prototyping of the programmable logic device, even if designing of the functional block, which is not a target of verification, has not yet been completed, verification by prototyping can proceed, thereby improving the efficiency of verification.

According to the present invention, the concurrent development system for concurrent development of an ASIC and a programmable logic device according to the present invention, further includes a monitoring unit that monitors the latest circuit data the user has and the scale of change in the circuit data incorporated in an implementation design by an implementation designer, to thereby obtain a monitoring result, a change timing informing unit that informs the user and the implementation designer of the ASIC by an e-mail that it is time to reflect the change monitored, based on the monitoring result and the time required for the layout designing, at a scheduled date and time, and a reflection suspension requesting unit using which the user requests suspension of reflecting the change monitored, by altering the date for reflecting the change monitored, in response to the e-mail.

According to the present invention, when the scale of change between the latest circuit data held by the user and the circuit data incorporated into the implementation designing by the implementation designer is monitored, and approaches the planned date based on the monitoring result and the time required for layout design, the user and the ASIC implementation designer are informed by an e-mail of the change and that it is time for reflecting the change in the ASIC implementation design. In response to this information, the user requests suspension, by changing the date for reflection. Thus, the generated change is reflected efficiently in layout designing of the ASIC. By setting the timing for reflecting the change, the user can determine until when the change can be made, and can review the schedule at an early stage.

According to the present invention, a method of creating a netlist for an FPGA and an ASIC, includes, on the one hand, creating FPGA design information in which identical terminals in a first design and a second design are connected, and a buffer corresponding to the FPGA is inserted between the terminals, from the first design and the second design, wherein terminal information of the FPGA including whole or a part of functional blocks of a plurality of functional blocks is described in the first design, and the terminal information identical to that of the FPGA described as a low-order layer of the first design is described in the second design, and on the other hand, creating ASIC design information in which identical terminals in a third design and a fourth design are connected, and a buffer corresponding to the ASIC is inserted between the terminals, from the third design and the fourth design, wherein terminal information of the ASIC including the functional blocks is described in the third design, and the terminal information identical to that of the ASIC described as a low-order layer of the third design is described in the fourth design, and replacing the second design by the FPGA design information created and the fourth design by the ASIC design information created, based on the connection information of the functional blocks included in each design.

Further, according to the present invention, to create a netlist for the FPGA and the ASIC, on the one hand, FPGA design information is created in which the same terminals in a first design and a second design are connected, and a buffer corresponding to the FPGA is inserted between the terminals, from the first design in which terminal information of the FPGA including the whole or a part of functional blocks of a plurality of functional blocks is described, and the second design in which the same terminal information as that of the FPGA described as a low-order layer of the first design is described, and on the other hand, ASIC design information is created in which the same terminals in a third design and a fourth design are connected, and a buffer corresponding to the ASIC is inserted between the terminals, from the third design in which terminal information of the ASIC including the functional blocks is described, and the fourth design in which the same terminal information as that of the ASIC described as a low-order layer of the third design is described. This is followed by replacing each of the second design and the fourth design by the circuit information created based on the connection information of the functional blocks included in each design. Consequently, efficient concurrent development of the ASIC and the programmable logic device becomes possible, thereby reducing the development period of the ASIC.

BRIEF DESCRIPTION OF THE DRAWINGS

FIG. 17 is one example of a login screen;

FIG. 30 is one example of a compatible package table;

FIG. 32 is one example of a logic synthesis interface screen;

FIG. 34 is one example of a logic synthesis status screen;

FIG. 35 is one example of an input and execution screen of fitting data;

FIG. 36 is one example of a ROM data generating status screen;

FIG. 37 is one example of a schedule and result screen; and

FIG. 38 is one example of a operation time setting file.

BEST MODE FOR CARRYING OUT THE INVENTION

Exemplary embodiments of the present invention will be explained in detail with reference to the accompanying drawings.

Figure 1:
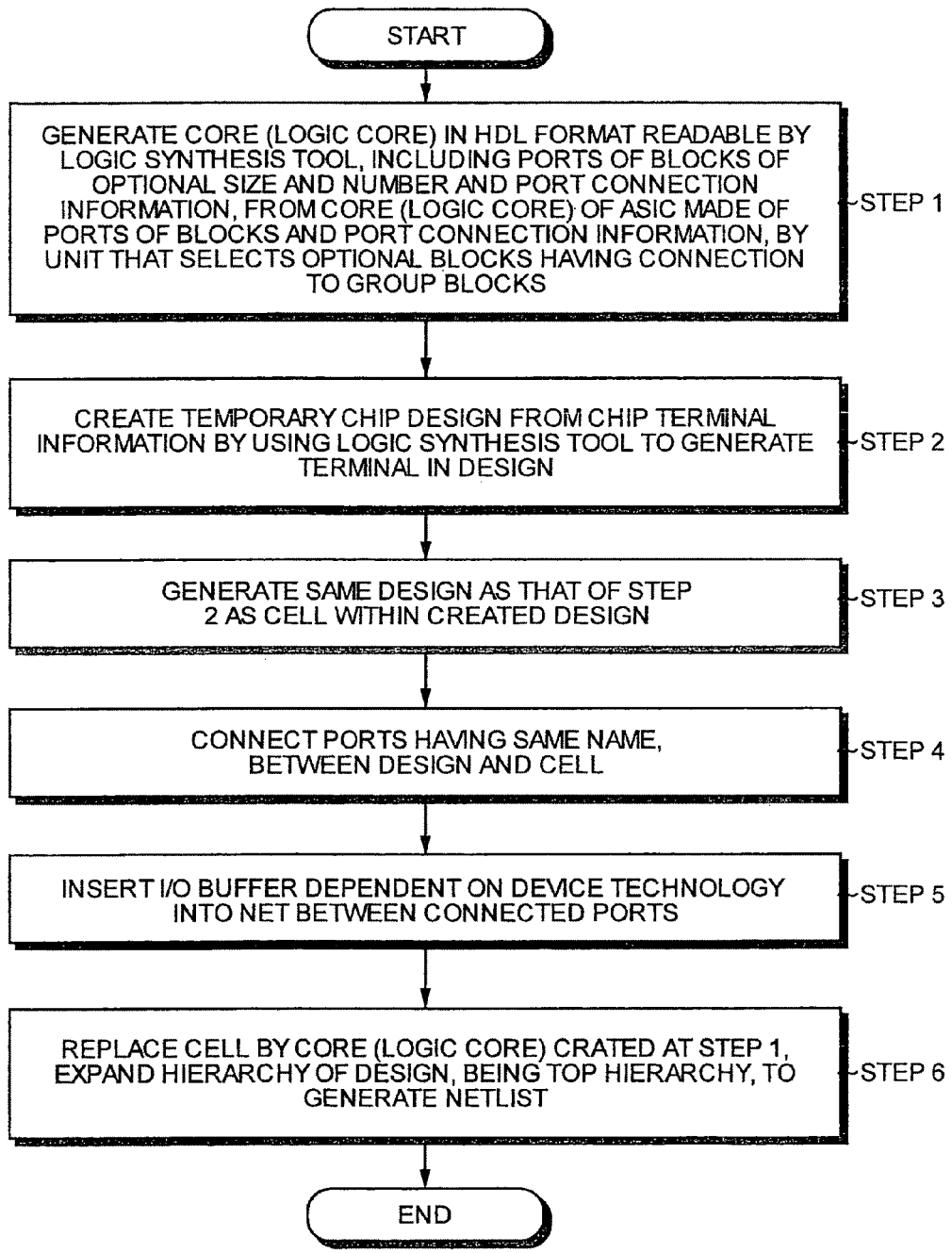
FIG. 1 is a flowchart of the principle of a method of the present invention.
Figure 2:
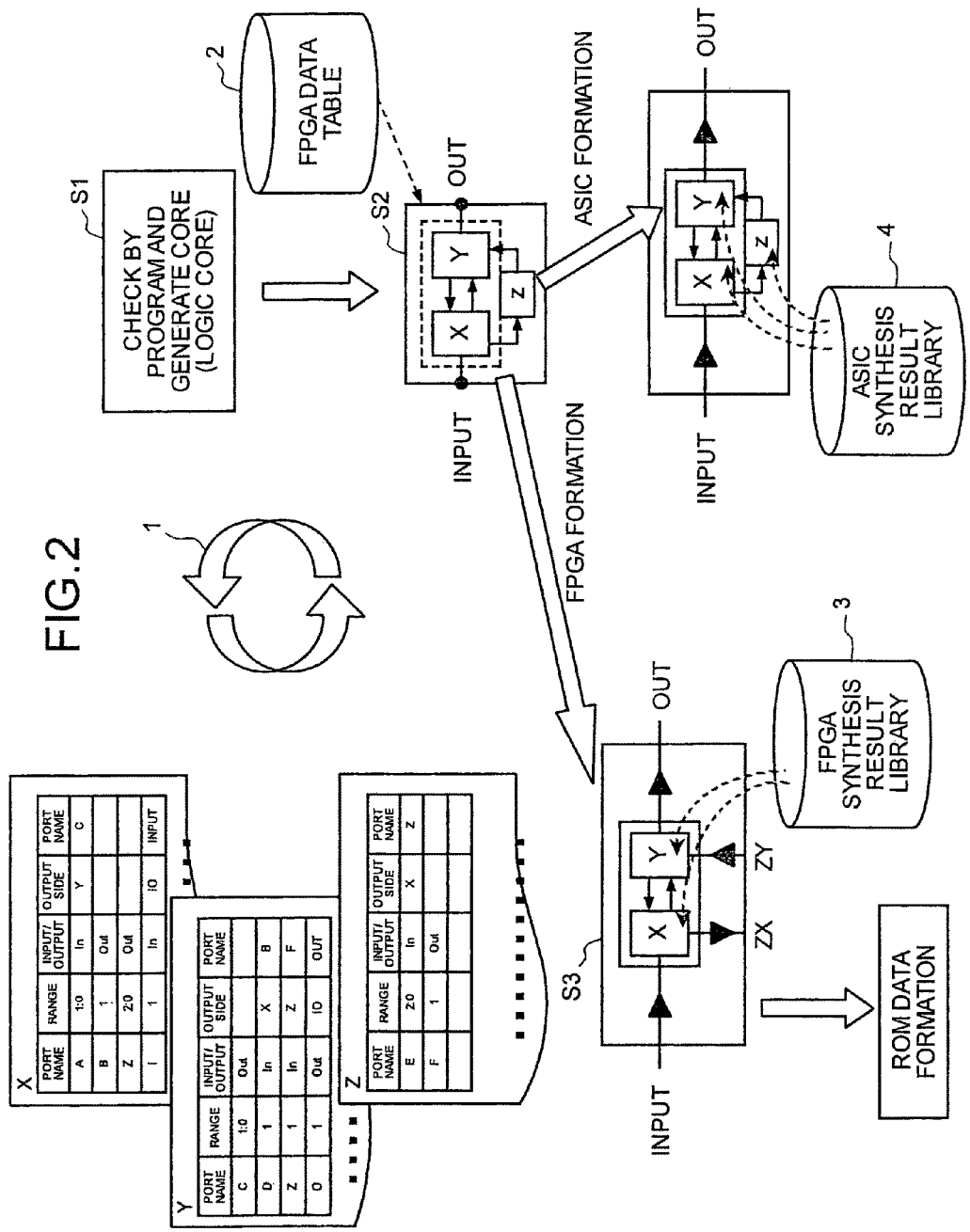
FIG. 2 is a diagram for explaining the operation of a first embodiment of the present invention.

FIG. 2 is a diagram for explaining the operation of the first embodiment of the present invention. An integrated circuit is developed based on shared design data and based on the study of the circuit architecture.

When designing a function to be realized using the HDL, a chip, being a product itself, is formed of an instance having a certain function. The instance refers to a block with a plurality of functions designed by the HDL, and multiple blocks if a specific block is necessary for realizing a function of the chip.

In FIG. 2, X, Y, and Z are tables in which a port specification of a block created after studying the circuit architecture is defined according to a defined format. These tables X, Y, and Z are always created when a block is designed, and include block name, instance name, port name, range, input/output, type, instance name on output side, output port name of the instance on the output side, and the like. These data are input manually by a user. It is the key point of the present invention to create the respective tables beforehand.

S1 is a step of generating a core (logic core) including only ports of blocks and connection information between the blocks, the step being executed by a unit that checks whether connection between instances and between an instance and an external terminal defined as a terminal of the instance and a terminal of a device package are realized without contradiction, and a unit that defines a net between the instances. If there is an error at step S1, the error is fed back to the user and the user re-inputs data (circular arrow 1 in the figure denotes repetition).

S2 is a step of referring to an FPGA table 2, reading the core (logic core) output at step S1 into a logic synthesis tool, selecting a group of instances forming a programmable logic device by controlling the function of the logic synthesis tool, generating a new core (logic core) in a state with hierarchical information being preserved, and outputting a netlist of a core (logic core) same as the core (logic core) output at step S1, and that does not include an I/O buffer and the like depending on the device technology.

S3 is a step of generating a temporary core (logic core) from a terminal name in terminal specification table data of a device package in a defined format, inserting the I/O buffer depending on the device technology specified by the table data into a port of the temporary core (logic core), and replacing the temporary core by the netlist output at step S2, which is the key point of the present invention. After creating the netlist of chips for a target device by this process, logic synthesized circuit data is read from an FPGA synthesis result library 3, based on the target device technology, by controlling the function of the logic synthesis tool, and inserting the read circuit data into the corresponding block, thereby completing the netlist for a desired device. The netlist generated as the FPGA is fitted by an FPGA layout tool to form ROM data.

An ASIC is formed by referring to an ASIC synthesis result library 4 at step S2.

According to the first embodiment, in the development of integrated circuits, the quality of a port specification of a block, being an input in RTL designing, is ensured beforehand. Further, even in the development of large scale integrated circuits in which there are many functional blocks and many design resources, since the connection between the blocks can be confirmed beforehand, it can be ensured that the chip is assembled without fail.

Figure 3:
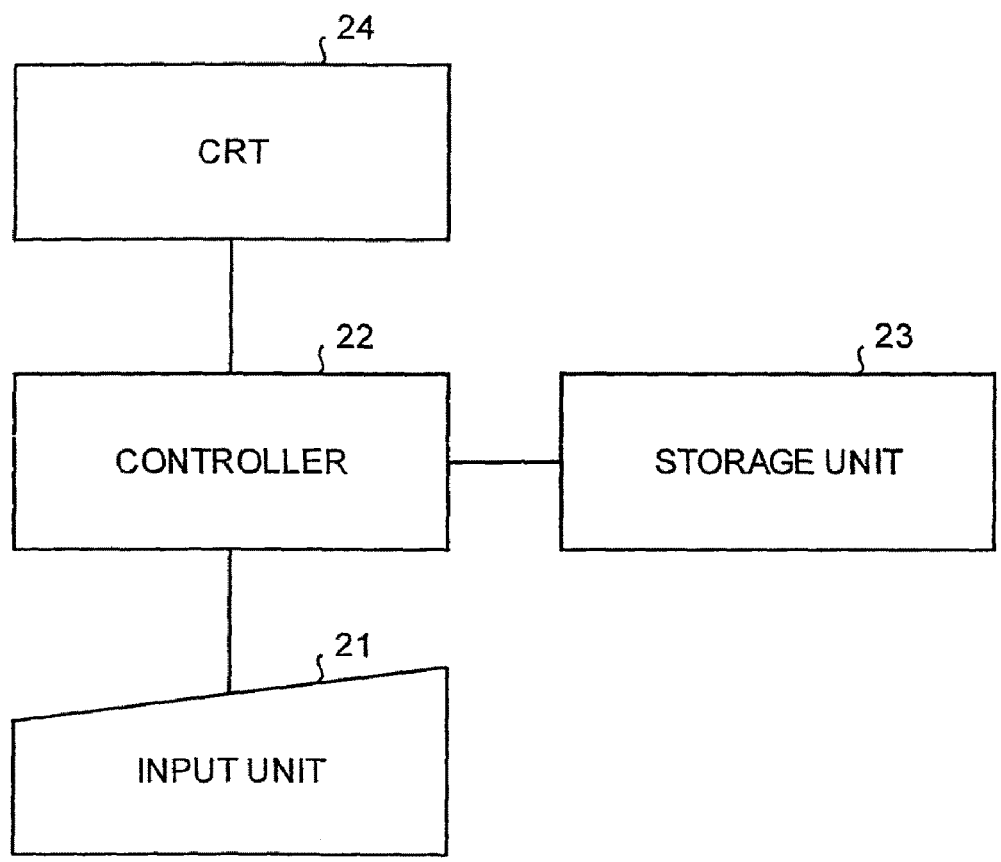
FIG. 3 is a block diagram of one embodiment of a logic synthesis tool controller of the present invention.

FIG. 3 is a block diagram of one embodiment of a logic synthesis tool controller of the present invention. A controller 22 controls the overall operation, a CRT 24 displays various kinds of information, an input unit 21 inputs various kinds of commands and the like to the controller 22, and a storage unit 23 stores various kinds of information, and is connected to the controller 22.

The input unit 21 inputs a core (logic core) generator program start command and a logic synthesis tool control command, and the logic synthesis tool, the core (logic core) generator program, and the logic synthesis control program are stored in the storage unit 23.

When a table file of the block is specified by the input unit 21 to input the core (logic core) generator program start command, the core (logic core) generator program reads the table file to generate a core (logic core), and outputs the file to the storage unit 23. If an error occurs during the process, error information is displayed on the CRT 24.

If there is an error, the designer corrects the table file and executes the command again. To control the logic synthesis tool, necessary data is first prepared as a file and stored in a predetermined location in the storage unit 23 together with the core (logic core) file generated by the core (logic core) generator program. When the input unit 21 inputs the logic synthesis tool control command, the logic synthesis tool is executed and the process result is displayed on the CRT 24. If the process fails, the state at the time of failure is displayed on the CRT 24.

Figure 4:
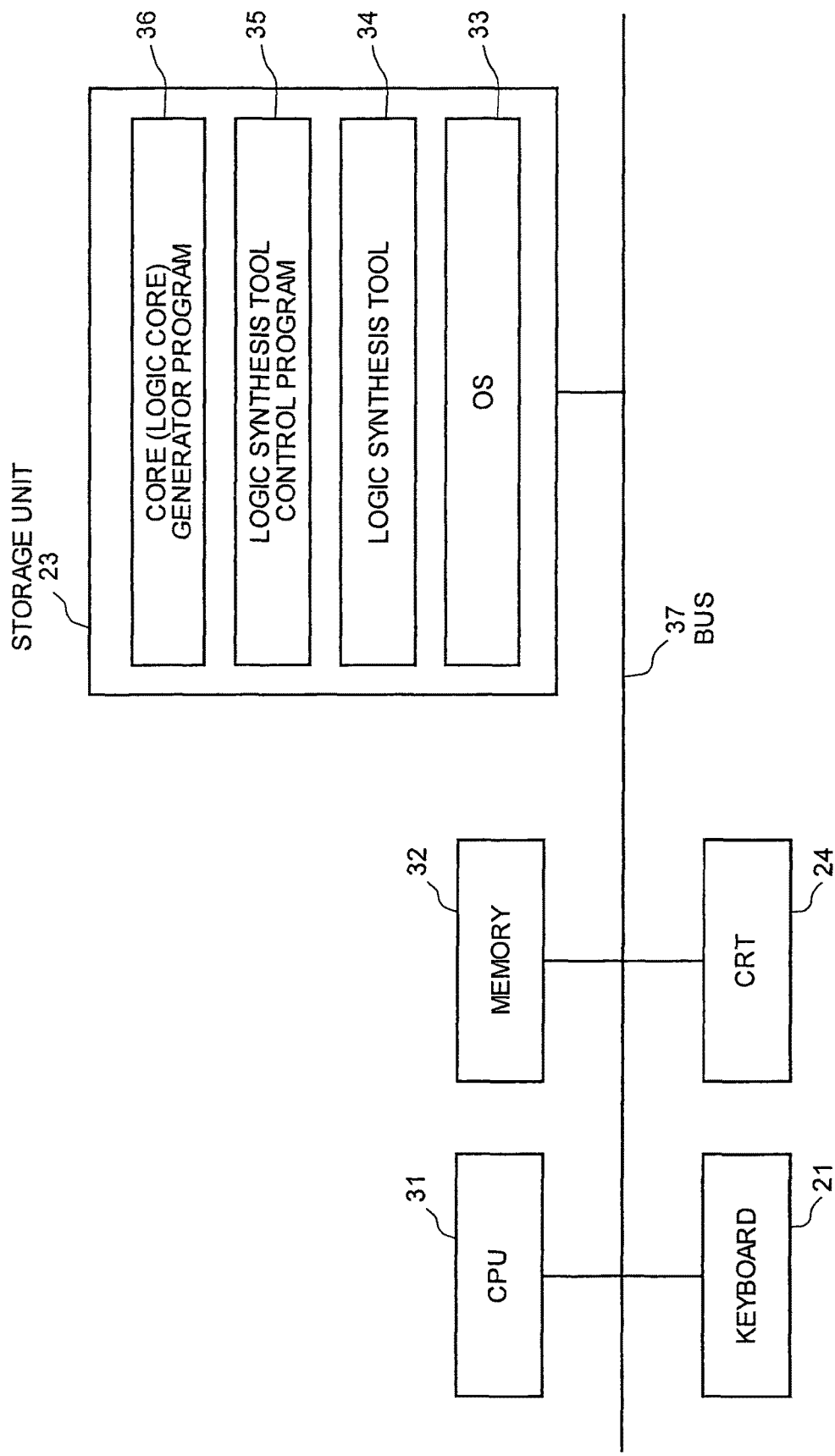
FIG. 4 is a block diagram of one embodiment of the controller.

FIG. 4 is a block diagram of one embodiment of the controller 22 shown in FIG. 3. Like parts in FIG. 3 are designated by like reference signs. In FIG. 4, a CPU 31 controls the whole operation, a memory 32 stores various kinds of information, a keyboard 21 inputs various commands and the like, and a CRT 24 is a display unit. A storage unit 23 includes a core (logic core) generator program 36, a logic synthesis tool control program 35, a logic synthesis tool 34, and an operating system (OS) 33. A bus 37 interconnects respective components. The storage unit 23 may be a hard disk drive.

In the system formed in this manner, when a command from the keyboard 21 is input to the CPU 31, the CPU 31 searches the storage unit 23 for the relevant program, and executes the relevant program.

Figure 5:
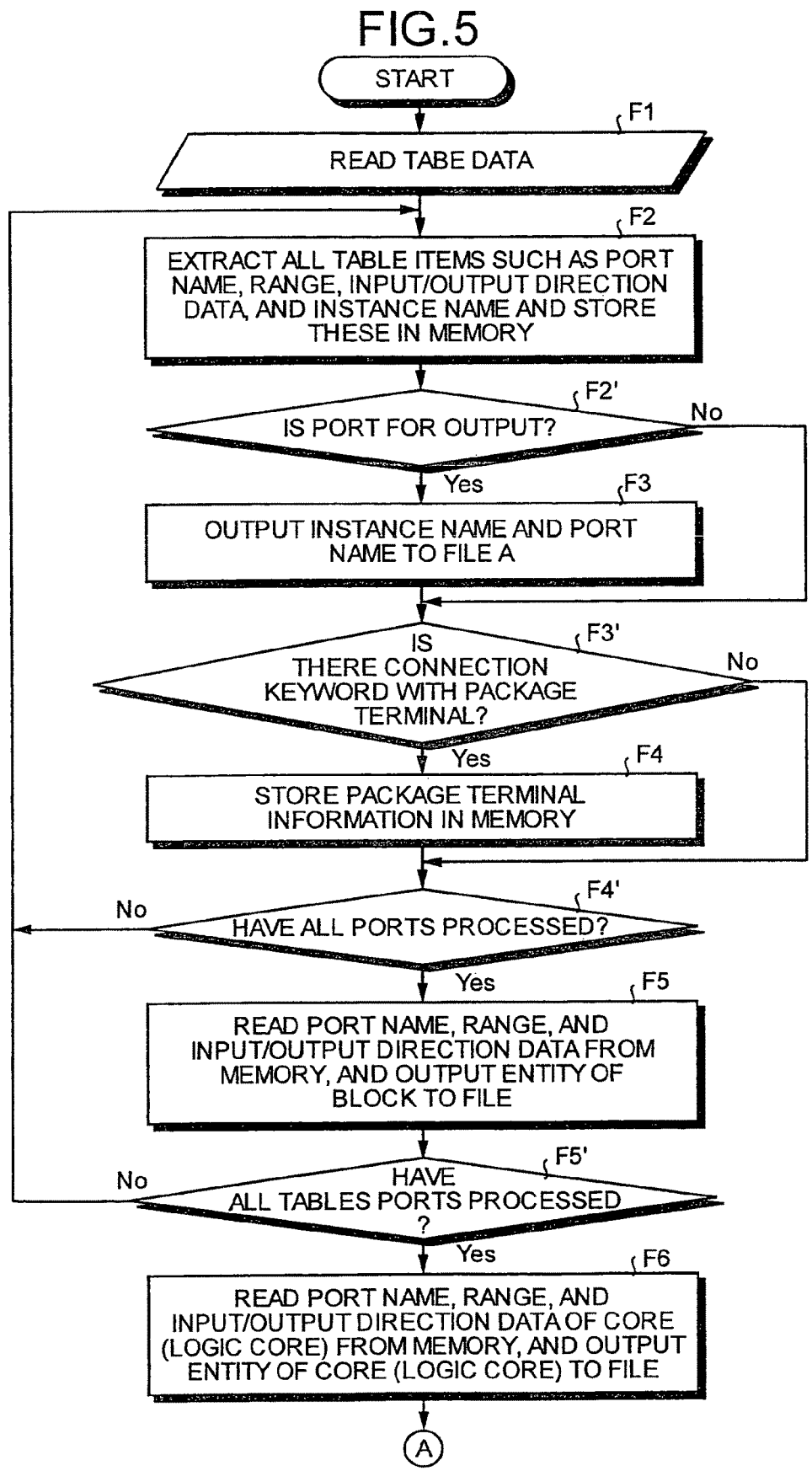
FIG. 5 is a flowchart (1) of a core (logic core) generator program.
Figure 6:
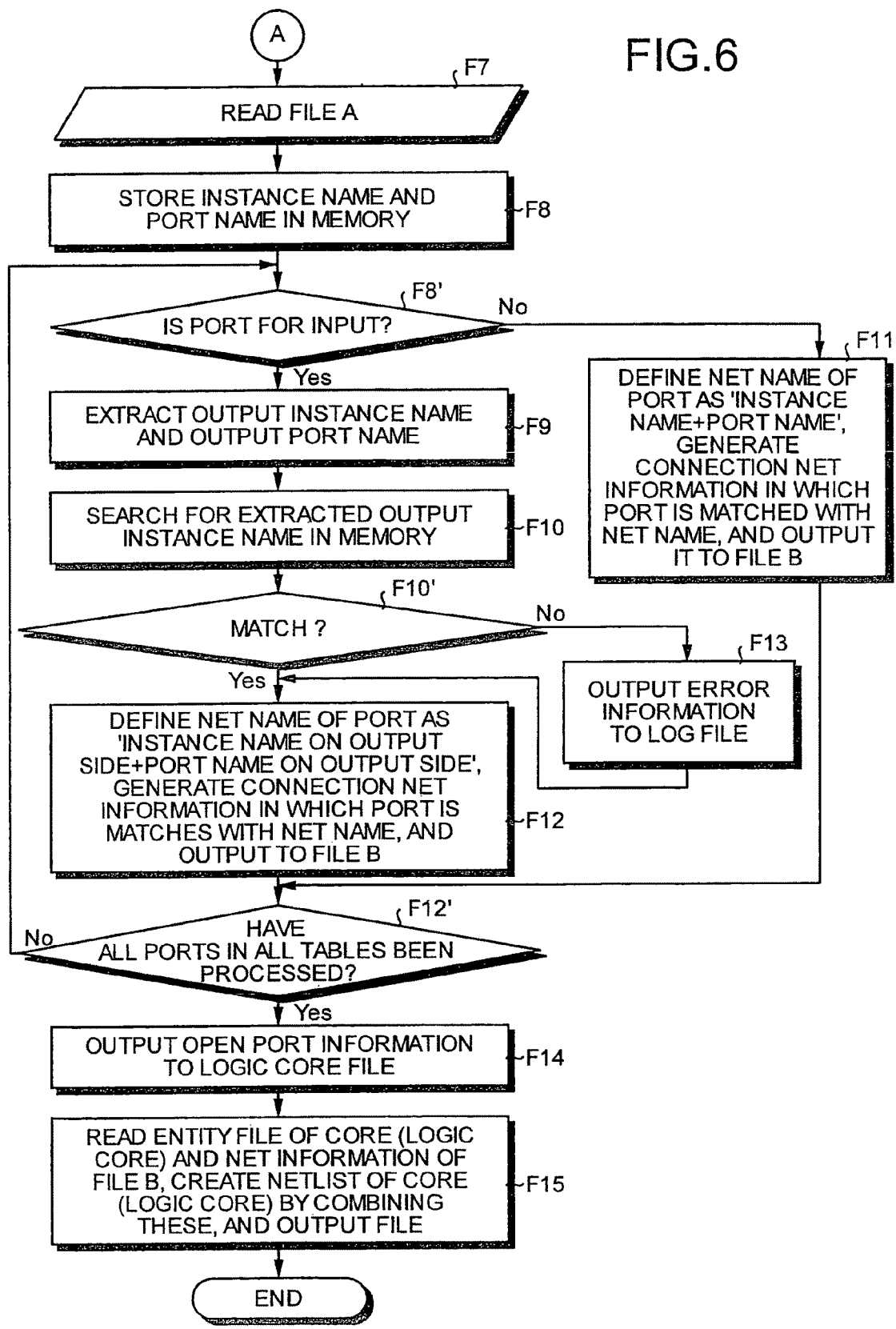
FIG. 6 is a flowchart (2) of the core (logic core) generator program.

FIGS. 5 and 6 are flowcharts of the core (logic core) generator program. Table data in X, Y, and Z in FIG. 2 will be used for explanation. The files in the table data X, Y, and Z (instances are also X, Y, and Z) are read, and processing is performed for each file one by one. The data in X is read at step F1, and the whole data in the table of port A is extracted and stored in the memory at step F2. The subsequent process is performed by referring to the data in the memory. Next, it is checked whether the port is for an output, at step F2'.

Because the port A is for input, control proceeds to step F3'. At step F3', it is checked whether there is a connection keyword with a package terminal. Because there is no connection keyword with the package terminal, step F4 of storing the package terminal information in the memory is skipped. Next, at step F2, the whole data of the next port B is stored in the memory.

Because the port B is for output, "XB" is output to the file A in the storage unit 23 at step F3. Here, X is a file name and B is a port name. Because there is no connection keyword with the package terminal, step F4 is skipped. Next, at step F2, the whole data of the next port Z is stored in the memory. Because the port Z is for output, "XZ[2:0]" is output to the file A at step F3. Here, [2:0] indicates 2, 1, 0.

Because there is no connection keyword with the package terminal, step F4 is skipped. Next, at step F2, the whole data of the next port I is stored in the memory. Because the port I is for input, step F3 is skipped. Because there is the connection keyword "IO" with the package terminal, "INPUT, in, 2:0" is stored as a port name of the core (logic core) in the memory. Next, it is checked whether the process for all ports has finished (F4'). If the process for all ports has not finished yet, control returns to step F2.

The processing for all ports in X is complete, and in the case of VHDL, an entity file having the following information is output to the storage unit 23.

A: in std_logic;
B: out std_logic;
Z: out std_logic vector (2 down to 0); and
I: in std_logic.

The above process is also performed for data of Y and Z. When the process has finished for the whole file (F5'), and if it is VHDL at step F6, the entity file of the core (logic core) having the following information is output to the storage unit 23.

INPUT: in std_logic;
OUT: out std_logic;
The following data is stored in the file A.
XB, XZ [2:0], YC [1:0], YO, ZF The data in the file A is read at step F7, stored in the memory at step F8, and the process is performed for the files one by one. At step F8', it is checked whether the port is for input. The table data in X will be explained here as an example. Because the port A is for input, at step F9, Y of the output side and C of the port name are extracted. At step F10, YC [1:0] is searched in the data stored at step F8. It is then checked if these match with each other at step F10'.

Because YC [1:0] is found in the search, connection information as shown below is output to a file B at step F12. If the result does not match therewith, error information indicating that the port name or the range is different is output to a log file in the storage unit 23, and is also displayed on the CRT 24.

A=>YC

Next, because the port B is for output, the following connection information is output to the file B at step F11.

B=>XB

Next, because the port Z is for output, the following connection information is output to the file B at step F11.

Z=>XZ

Next, the port I is for input, but "IOINPUT" cannot be found by the search at step F10. Therefore, at step F13, this matter is output to the log file as an error, and displayed on the CRT 24. However, in the case of a port connected to a terminal of the package, there is no problem. On the contrary, it can be confirmed which port in which instance is connected to which terminal of the package, from the error information output to the log file. Next, at step F12, the following connection information is output to File B.

I=>IOINPUT

At step F12', it is checked whether the process for all ports in all tables has finished, and if not, control return to step F8'.

The above processing is also performed for the table data in Y and Z, and when the processing has finished, a port for which the connection information cannot be formed is output to the log file at step F14. At step F15, the entity list of the core (logic core) output at step F6 is combined with the connection information output at steps F11 and F12, to create a netlist of the core (logic core), and the netlist is output to the storage unit 23.

Figure 7:
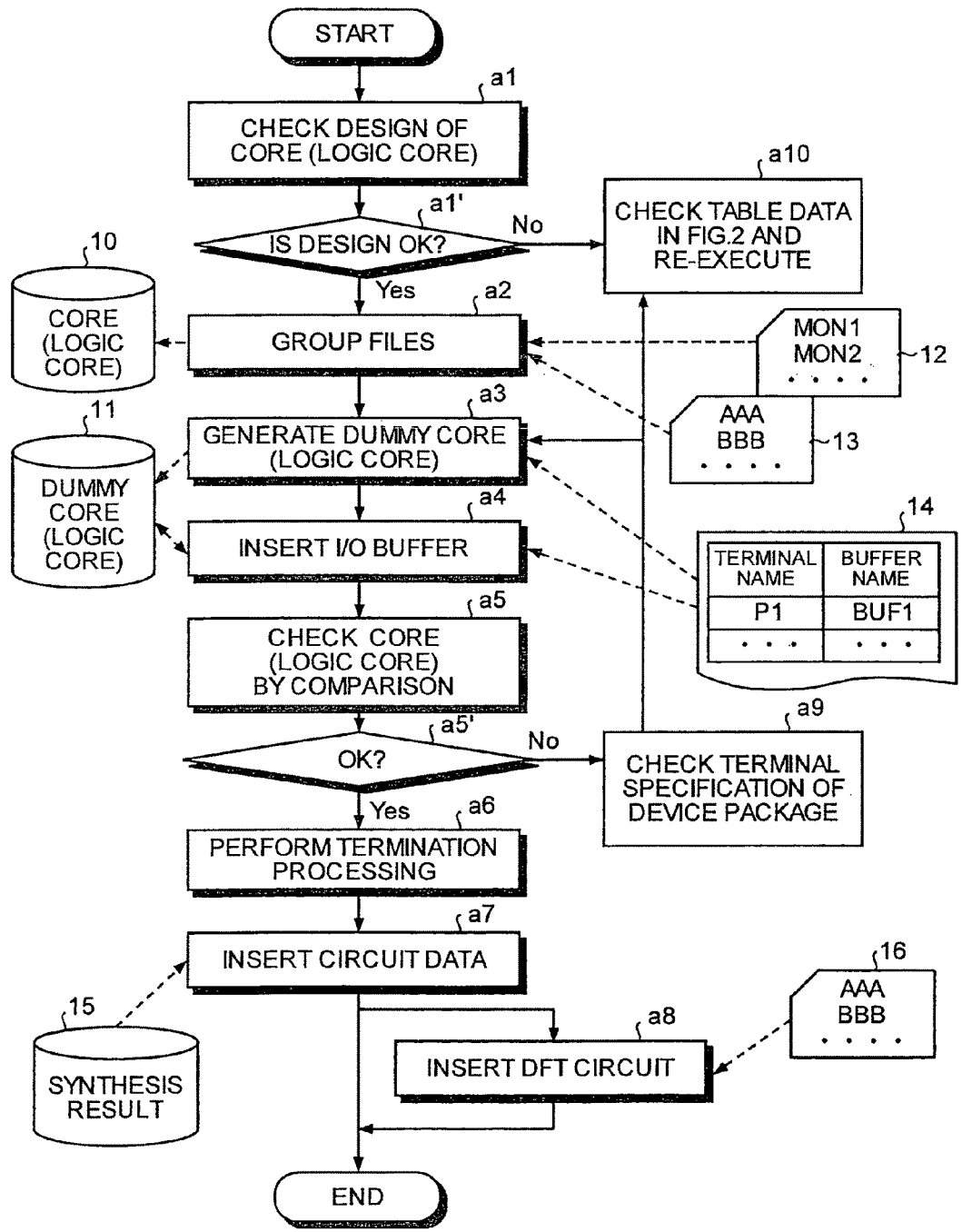
FIG. 7 is a flowchart of the detailed procedure in the first embodiment of the present invention.

FIG. 7 is a flowchart of the detailed procedure in the first embodiment of the present invention. This flowchart depicts in detail, the processing at S2 onward, in which the core (logic core) output at S1 is input (see FIG. 2). In FIG. 7, a solid line indicates the flow of the process, and a broken line indicates the flow of the data.

A core (logic core) design is first checked (step a1). It is then checked whether the core (logic core) design is OK (step a1'). If the core design is not OK, the table data in FIG. 2 is checked and the processing is executed again (step a10). If the core design is OK, the files 12 and 13 are referred to, grouped (step a2), and stored as the core (logic core) 10. A dummy core (logic core) 11, including the terminal name and the buffer name, is generated by referring to the table 14 (step a3).

The I/O buffer is inserted therein based on the dummy core (logic core) 11 and the table 14 (step a4). The core (logic core) 10 and the dummy core (logic core) 11 are checked by comparison (step a5). It is then checked whether the core (logic core) is OK (step a5'). As a result of comparison, if the core (logic core) is OK, termination processing is performed (step a6). If it is not OK, the terminal specification of the device package is checked (step a9), the table data in FIG. 2 is checked, and the processing is re-executed.

After the termination processing at step a6, the circuit data is inserted by referring to a synthesis result file 15 (step a7), and a DFT circuit is inserted by referring to a file 16 (step a8).

Figure 8:
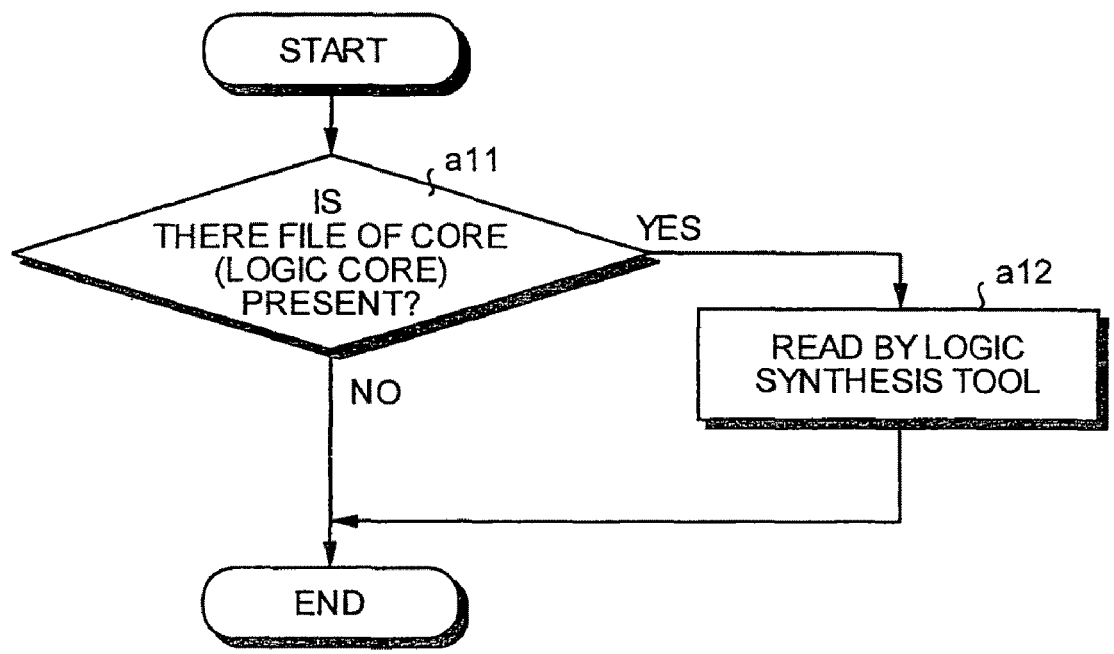
FIG. 8 is a flowchart of core (logic core) design check control.

Next, the various steps explained in FIG. 7 will be explained in further detail. FIG. 8 is a flowchart of core (logic core) design check control. At first, it is checked whether a file of the core (logic core) is present (step a11), and if the file is present, the logic synthesis tool reads the file (step a12). If not, nothing is done. At step a1 (see FIG. 7), the core (logic core) output at step S2 of FIG. 2 is input. At the step of checking the HDL descriptive grammar of the core (logic core) and an unused input port and the like, if the file of the core (logic core) is present, then at step a12, the core (logic core) is read by the logic synthesis tool. The logic synthesis tool has a function of checking the grammar and the like at the time of reading the file, and in case of an error, the content is confirmed from the CRT, the table data describing the port specification of the block is reviewed, and the design check is executed again, as shown at step a10.

Figure 9:
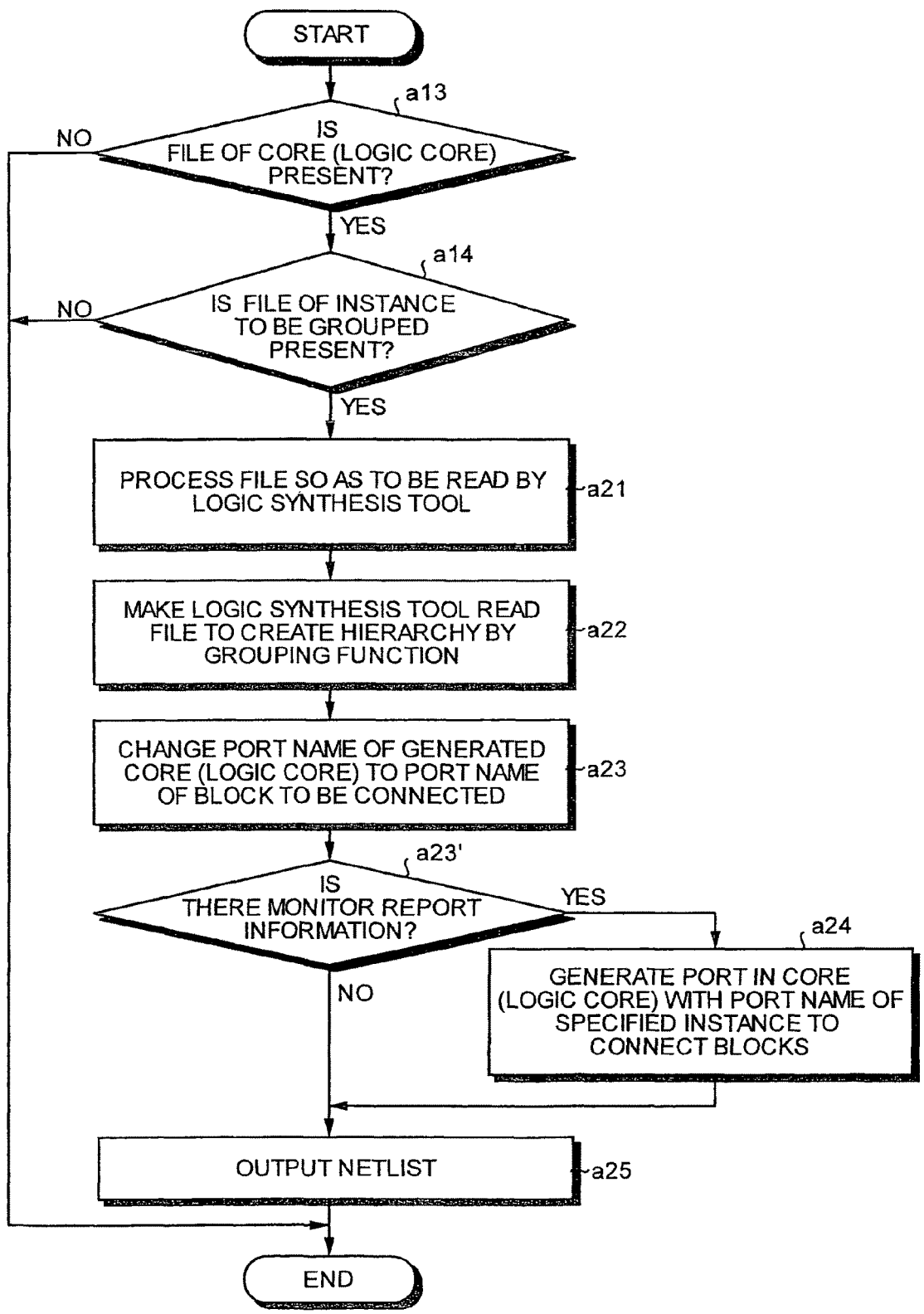
FIG. 9 is a flowchart of grouping control.

FIG. 9 is a flowchart of the grouping control, and includes the details of step a2 of FIG. 7. At first, it is checked whether a file of the core (logic core) is present (step a13). If the file is present, it is checked whether a file of instances to be grouped is present (step a14). When there is the file, that is, when there is no problem in the result at step a1. If there is a file 13 in which the block name to be formed into the programmable logic device is written, one block per line, the file 13 is read (step a21), and grouped as a new core (logic core) by controlling the grouping function of the logic synthesis tool, in a state such that the hierarchy information of the target block is maintained (step a22).

When the grouping function is used, because the port name of the core (logic core) becomes the net name for connecting the instances, the net is traced into the core (logic core) with respect to all ports of the core (logic core), a new port is generated in the core (logic core) in a port name of the first instance found, and connected to a new port that has generated a net connected to the port of the core (logic core), having the name of the net, and the port having the net name is deleted (step a23). This for creating a new port and deleting an old port.

It is then checked whether there is monitor port information (step a23'). If there is monitor port information, a port is generated in the core (logic core) in a port name of a specified instance, and connected to a terminal of the block (step a24). If there is no monitor port information, a netlist that does not include an I/O buffer or the like depending on the device technology is output to the storage unit 10 (see FIG. 7) (step a25). In such a case, this can be confirmed on the display unit, by using the display function of the logic synthesis tool.

At step a2 of FIG. 7, if necessary, the port of the grouped blocks can be generated as a port of the core (logic core) (step a24). This function is used when there is a port to be monitored at the time of evaluating the function of the programmable logic device. The specifying method is executed, by performing grouping, changing the port name, and then reading the file in which one port name is written per line, as shown in file 12.

Up to this step, there should be no error in the port connection between blocks in the core (logic core), because the designer himself generates the core (logic core) by using the data for determining the port specification of the block. However, in the case of the ASIC in which the core (logic core) generated at step S1 (see FIG. 2) is directly used, generally the terminal name of the device package to be defined in the table data of the block within the core (logic core) is determined by referring to the terminal specification of the device package, and as such, there may be a difference due to a simple mistake or a change from the print substrate design. In contrast, when the port of the core (logic core) generated at step a2 (see FIG. 7) becomes the terminal of the device package, because the port specifies the specification, there may be a difference as well. This problem is solved by steps a3 to a5.

Figure 10:
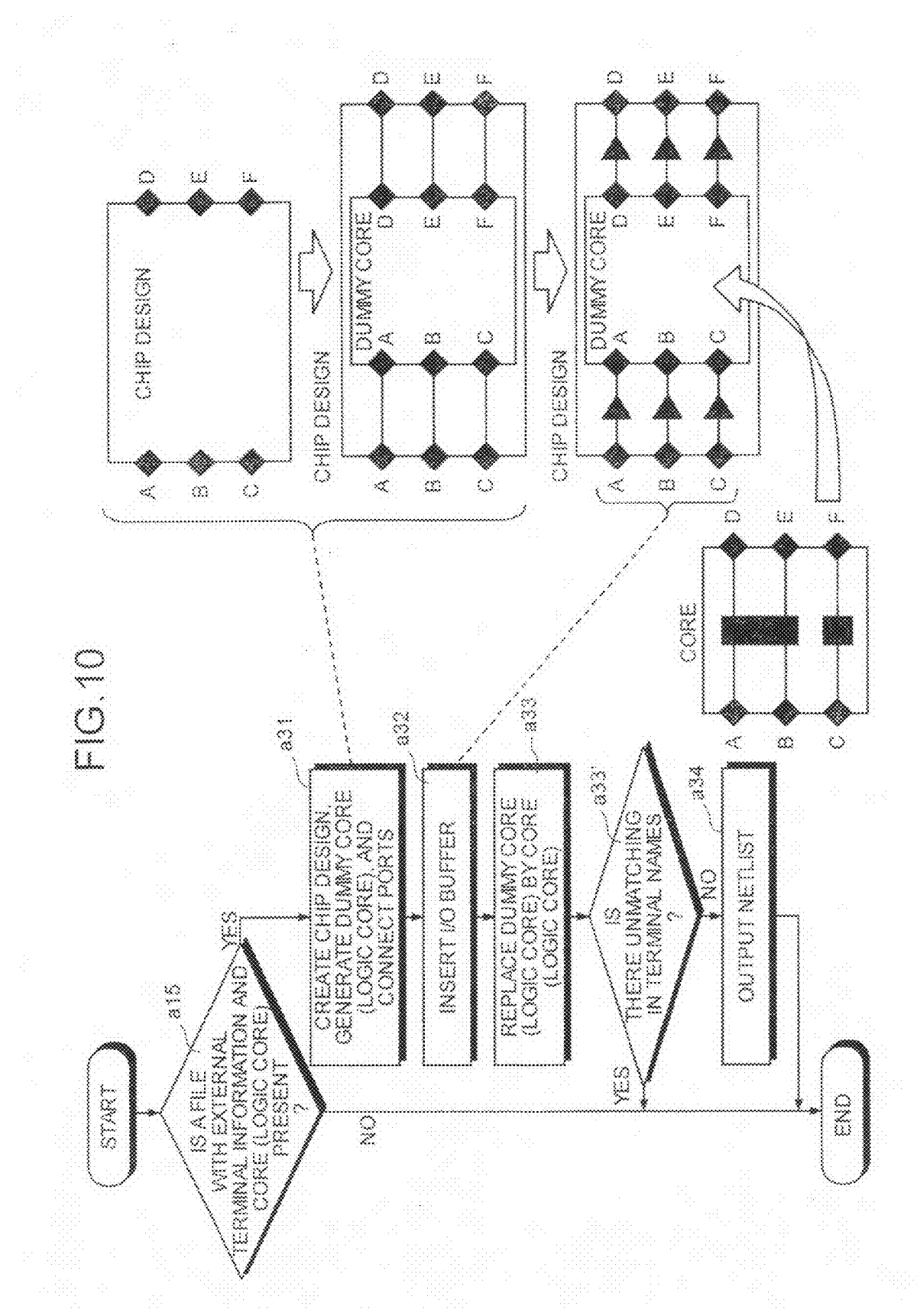
FIG. 10 is a flowchart for controlling the insertion of an I/O buffer and an image in the process.
Figure 11:
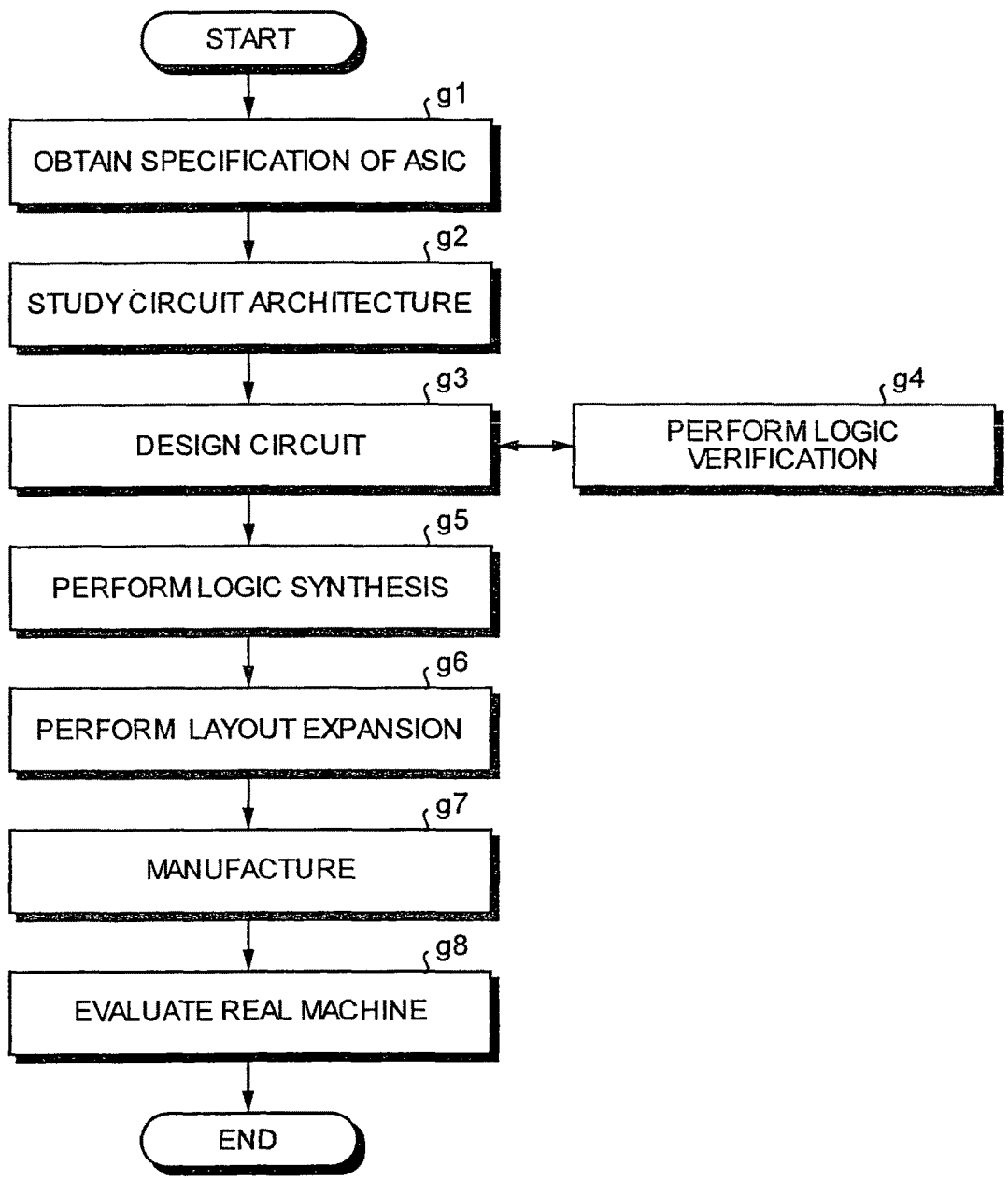
FIG. 11 is a flowchart of a procedure for designing integrated circuits.

FIG. 10 is a flowchart for controlling the insertion of the I/O buffer and an image in the process. This flowchart depicts the process at step a4 in FIG. 7. In the explanation below, steps from a3 to a5 are separate, but actually, the process is a series of processes within one command.

At first, it is checked whether there is a file with external terminal information and the core (logic core) (step a15). If there is such a file, the following processing is performed. At step a3, different from step a2, as shown in 14 in FIG. 7, if there is table data of terminal specification of the device package in which a terminal name is defined in the first column, and the I/O buffer name depending on the device technology to be used is defined in the second column, the table data is read to create a dummy chip design (a first design describing the terminal information with the name written in the first column) (step a31). The dummy chip design is generated as a cell (a second design describing the terminal information identical to the first design, described as a low-order layer of the first design), the design is connected to a port having the same name as that of the cell, and a dummy core (logic core) is output to the storage unit 11.

At step a4, the dummy core (logic core) in the storage unit 11 is read, and the I/O buffer depending on the device technology, written in the second column in the terminal specification table data 14 of the device package, is inserted from the chip terminal information into the net of the dummy core (logic core).

At step a5, from among the ports of the dummy core (logic core), a port for testing a specific device not related to the logic that is not related to functions, is deleted, the dummy core (logic core) is replaced by the core (logic core) in the storage unit 10 as a cell therein (step a33), and it is checked whether there is unmatching in the terminal name (step a33'). If the corresponding port names of the two cores (logic cores) match with each other, insertion is successful. In this manner, the terminal name in the terminal specification table data of the device package, and the port name of the core (logic core) can be crosschecked, thereby solving the above problem. If there is unmatching, the processing ends, and if there the names match, the netlist is output.

If the insertion fails, as shown in step a9 of FIG. 7, the terminal specification of the device package is checked, and the control returns to step a3. Alternatively, control returns to step a10, where the table data defining the terminal specification of the block is checked, and step S1 onward are repeated (see FIG. 2). If the insertion is successful, the hierarchy of the core (logic core) is expanded to form a chip.

At step a6, a flip-flop is connected to the input/output ports of all blocks of the chip, and termination processing is performed. This termination processing is for creating an error-free netlist, even if there is a block in which the circuit design is not complete, thereby enabling the layout work.

At step a7, the logic synthesized circuit data is read from a synthesis result library and inserted in a corresponding block. At this time, if there is no synthesis result with respect to a block in the chip, and the design name or cell name of the block conforms to the naming rule, the input port and the output port of the block are connected within the block according to a predefined rule.

This process is executed when there is no synthesis result in the case of the programmable logic device, and a specific block such as DLL of the programmable logic device is changed into an ASIC. By the process for connection within the block without deleting the block, the architecture can be maintained. Further, when there is a macro such as a memory in the block, the macro is replaced by circuit data of a device-specific memory.

Step a8 is a process performed in the case of the ASIC. A SCAN test circuit for testing the device is automatically inserted, or a file 16 defining the order of blocks connected to the SCAN test circuit is input, and connection is performed according to the defined order.

According to the first embodiment, the core (logic core) is generated from the data from the design document, and a new core (logic core) is generated for the programmable logic device from the core (logic core), in the state with the hierarchy structure and the connection information being preserved. Consequently, the circuit architecture can be shared, and the circuit data and the net between the instances that do not depend on the device technology within the instance in which the insertion function of the circuit data in the core (logic core) has been verified can avoid re-verification when the ASIC is formed. Thus, the concurrent development of the ASIC and the programmable logic device can be performed efficiently.

The concurrent development of the ASIC and the FPGA according to the present invention will be explained in detail as a second embodiment. There are various logic design languages such as C language, UML, and the like, but in the second embodiment, HDL is exemplified as the design language.

Figure 12:
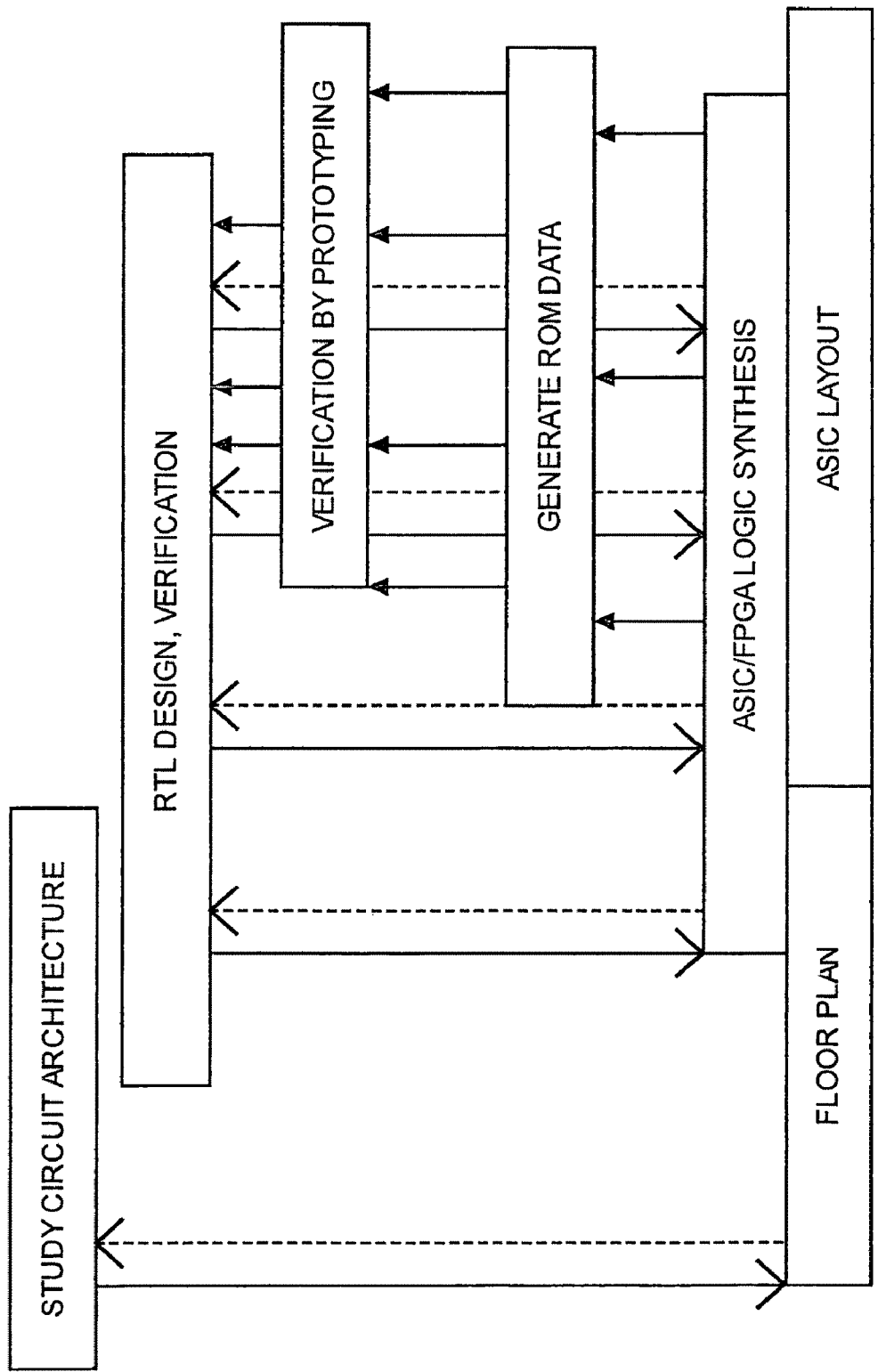
FIG. 12 is a diagram for explaining the concept of concurrent development of an ASIC and an FPGA according to a second embodiment.

At first, the concept of the concurrent development of the ASIC and the FPGA according to the second embodiment will be explained with reference to FIG. 12. The characteristic of the concurrent development of the ASIC and the FPGA is that in order to execute prototyping verification by the FPGA concurrently with the implementation designing of the ASIC, ROM data in which an FPGA circuit required for the prototyping verification is recorded, is provided by the implementation design of the ASIC, so that the development of the ASIC and the FPGA can be made seamless.

In the concurrent development of the ASIC and the FPGA, the prototyping verification by the FPGA is taken into consideration during the study of circuit architecture, division of functions to be realized in a circuit to be realized having a suitable expected size and hierarchization of functions due to structural difference between the ASIC and the FPGA is carried out, to thereby create a common functional block configuration between the ASIC and FPGA designs, and a port specification of the functional block. The data of the functional block configuration and the port specification data of the functional block becomes data common to the floor plan for ASIC implementation designing, logic synthesis, and layout designing.

In RTL designing and verification, RTL designing common to the ASIC and the FPGA is performed according to the structure obtained after studying the circuit architecture, and software verification is performed using a logic verification tool, with emphasis on a corner case for each function. The logic synthesis of the ASIC is executed concurrently with the RTL designing and verification, and after the characteristics as the ASIC can be ensured, logic synthesis of the FPGA is executed, to form a circuit in the FPGA on a substrate for prototyping sequentially, thereby enabling verification by the FPGA prototyping.

On the other hand, in the ASIC layout, software verification and the verification result by prototyping are reflected concurrently at any time, based on the common functional block configuration between the ASIC and FPGA designs, thereby shortening the period from the completion of verification by the FPGA prototyping to the completion of development of the ASIC.

Figure 13:
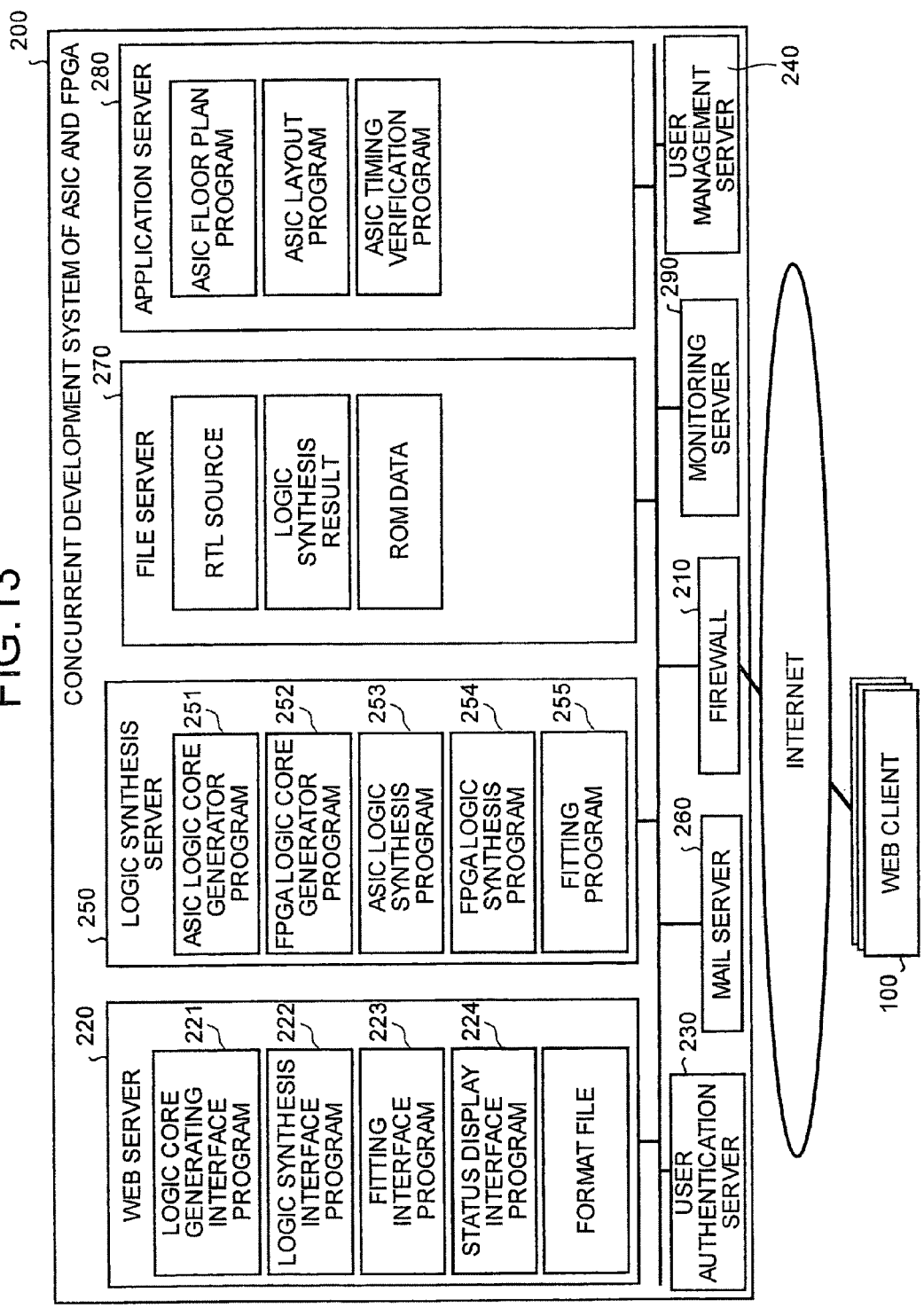
FIG. 13 is a functional block diagram of a system configuration of a concurrent development system of the ASIC and the FPGA according to the second embodiment.

The system configuration of the concurrent development system of the ASIC and the FPGA according to the second embodiment will be explained next, with reference to FIG. 13. The concurrent development system 200 of the ASIC and the FPGA includes a firewall 210, a Web server 220, a user authentication server 230, a user management server 240, a logic synthesis server 250, a mail server 260, a file server 270, an application server 280, and a monitoring server 290. The concurrent development system 200 of the ASIC and the FPGA can be used via the Internet from a Web client 100.

The firewall 210 is a computer that accepts only an access request according to a preset communication procedure from among access requests through the Internet, to prevent illegal access from the outside to the concurrent development system 200 of the ASIC and the FPGA.

The Web server 220 performs information transmission in response to a request from the Web client 100 made through the Internet. The Web server 200 includes a logic CORE generating interface program 221 that generates a logic CORE only from ports of functional blocks constituting the ASIC or the FPGA and the port connection information of the functional blocks, a logic synthesis interface program 222, a fitting interface program 223, a status display interface program 224, a format file required for generating the logic CORE, and a format file required for logic synthesis. The computer executes these programs in response to a request from the Web client 100, and transmits the result to the Web client 100.

The user authentication server 230 performs authentication of users, and user names and passwords to be used are registered therein based on the matching. The user management server 240 registers and deletes users, and user names, project names, and e-mail addresses to be used are registered therein based on the matching.

The logic synthesis server 250 includes an ASIC logic CORE generator program 251, an FPGA logic CORE generator program 252, an ASIC logic synthesis program 253, an FPGA logic synthesis program 254, and a fitting program 255 that is a layout of the FPGA. The logic synthesis programs and the fitting program in the logic synthesis server 250 are activated from the logic synthesis interface program 222, and are meant to read an RTL source stored in the file server 270 and to execute logic synthesis of the ASIC and the FPGA and fitting of the FPGA.

The mail server 260 includes mail transfer software, and distributes the processing information of the process executed by the Web server 220 and the information from the Web client 100 to the user and the system, by e-mail.

Figure 14:
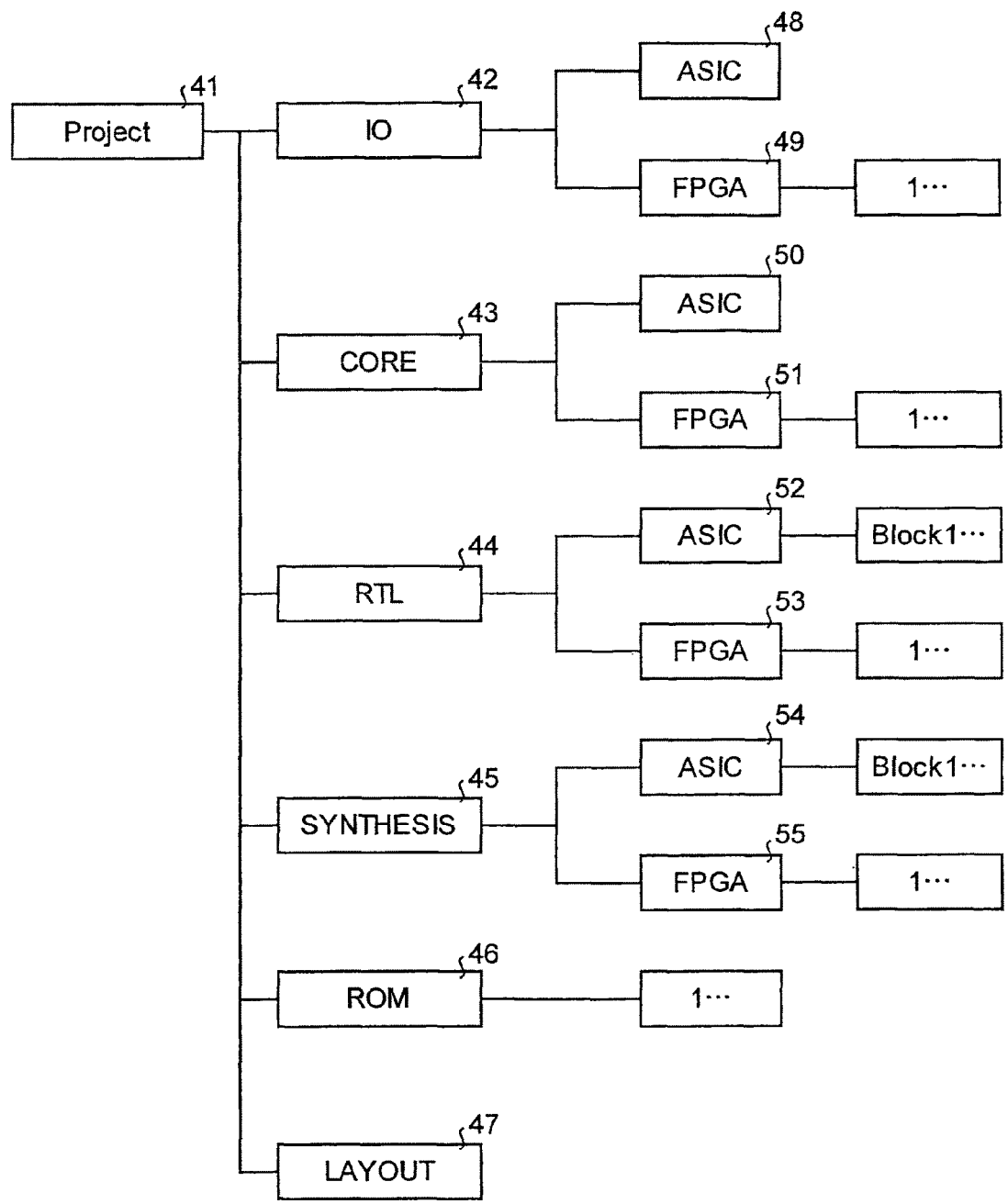
FIG. 14 is one example of a directory configuration for storing data in a file server.

The file server 270 stores the RTL source to be logic synthesized, the logic synthesis results, and ROM data of the FPGA. FIG. 14 is one example of a directory configuration for storing data in the file server. Project 41 is a directory of project names for developing the ASIC and the FPGA, or nicknames of the ASIC, and the name is set based on the matching.

Figure 15:
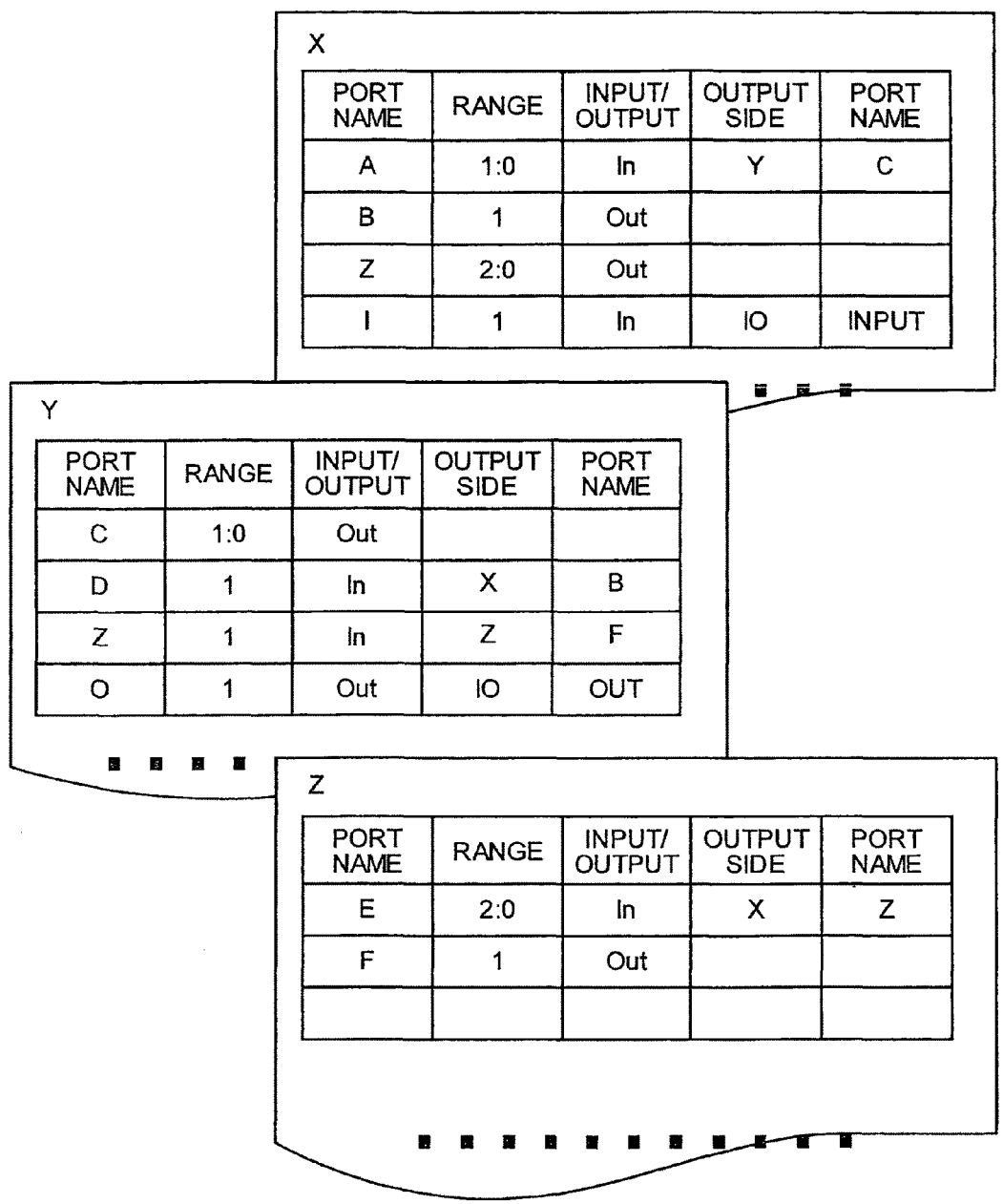
FIG. 15 is one example of a logic CORE generation table.

IO 42 is a directory that stores data for generating the logic CORE, and includes, for each functional block constituting the ASIC, a directory ASIC 48 that stores a file of tables for generating the logic CORE describing the port specification of the functional blocks shown in FIG. 15, and a directory FPGA 49 that stores the file of tables for generating the logic CORE in the directory ASIC 48 copied by the logic CORE generating interface program 221 according to a designation of a user. Further, under the directory FPGA 49, there are a number of directories equal to the number of the FPGAs set by the user. The details of the table for generating the logic CORE and the logic CORE generating interface program 221 will be described later.

CORE 43 is a directory that stores the logic CORE generated by the logic CORE generator program, and includes a directory ASIC 50 for storing the logic CORE of the ASIC generated from the port specification of the functional blocks constituting the ASIC, and a directory FPGA 51 for storing the logic CORE of the FPGA from the port specification of the functional blocks constituting the FPGA.

RTL 44 is a directory that stores circuit design data (hereinafter, "RTL") expressed in the HDL uploaded by the user from the logic synthesis interface (described later), and includes a directory ASIC 52 for storing the RTL in a unit of functional block constituting the logic CORE of the ASIC, and a directory FPGA 53 for copying the RTL in the ASIC directory according to a designation of the user and storing the RTL.

SYNTHESIS 45 is a directory that stores the result of logic synthesis of the RTL performed by the logic synthesis server 250, and includes a directory ASIC 54 that further includes a directory for storing the logic synthesis results of the ASIC for each functional block constituting the ASIC logic CORE, and a directory FPGA 55 having a directory for storing the logic synthesis results of the corresponding FPGA.

ROM 46 is a directory for storing the ROM data that stores the FPGA circuit data generated after fitting that is the FPGA layout, based on the logic synthesis results of the FPGA, and includes a directory for storing each FPGA. LAYOUT 47 is a work directory using which a layout designer of the ASIC performs layout designing of the ASIC.

The application server 280 (see FIG. 13) includes an ASIC floor plan program, an ASIC layout design program, and an ASIC timing verification program. An implementation designer uses this computer to execute the floor plan, the layout designing, and timing verification of the ASIC.

The monitoring server 290 obtains a user name and a project name registered in the user management server 240, to compare the data in the directory LAYOUT 47 managed by the implementation designer and the data in other directories, to perform logic synthesis, and to collect time required by the tool for the layout processing, in the data in the directories of the respective project names, twice, once in one day. At the first time, contents of the changes are informed to the implementation designer, and at the second time, the schedule reflecting the change is updated based on the collected time.

Figure 16:
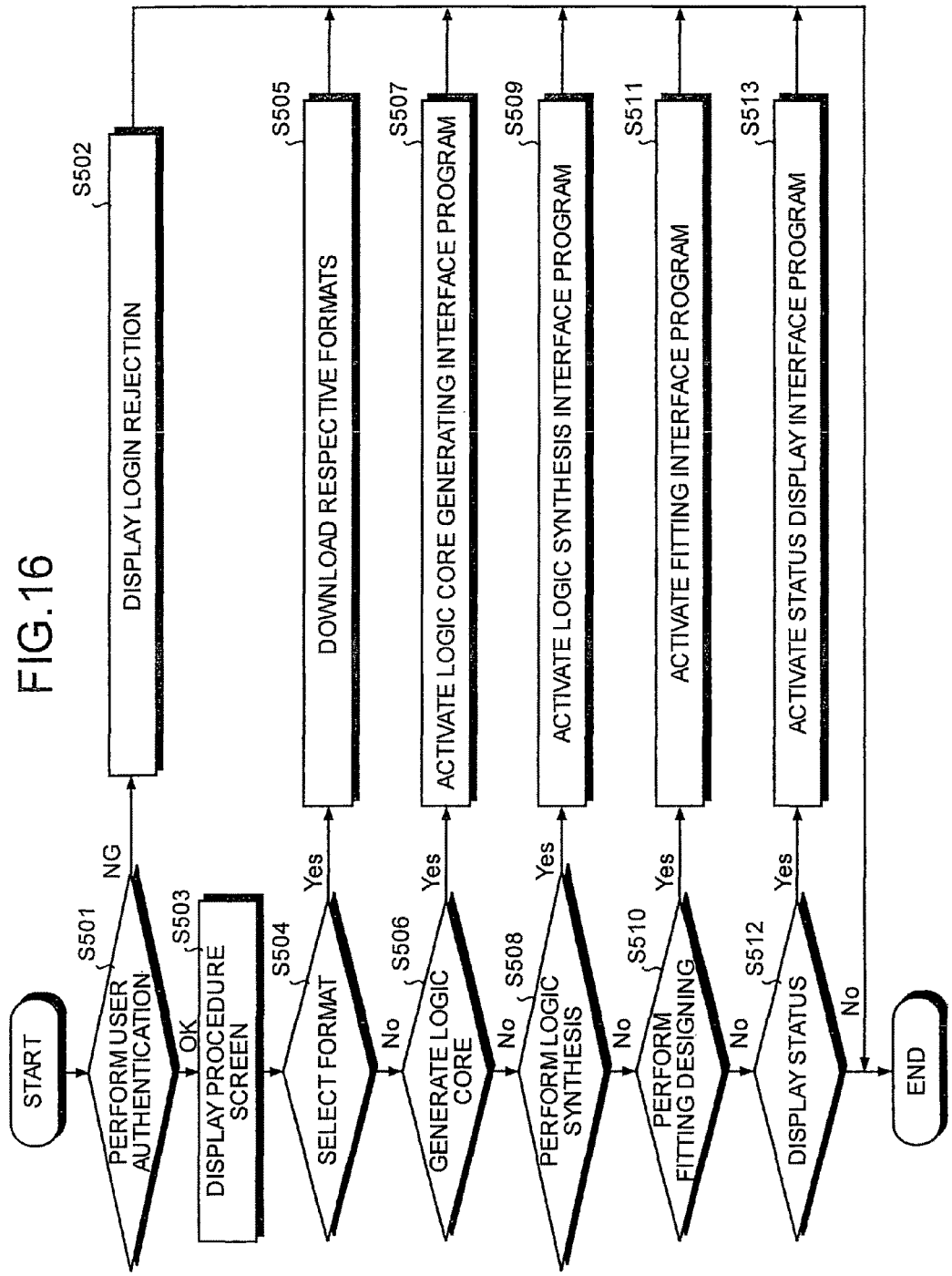
FIG. 16 is a flowchart of a process procedure of the concurrent development system of the ASIC and the FPGA in the second embodiment.

The process procedure of the concurrent development system 200 of the ASIC and the FPGA in the second embodiment will be explained with reference to the flowchart in FIG. 16.

Figure 17:
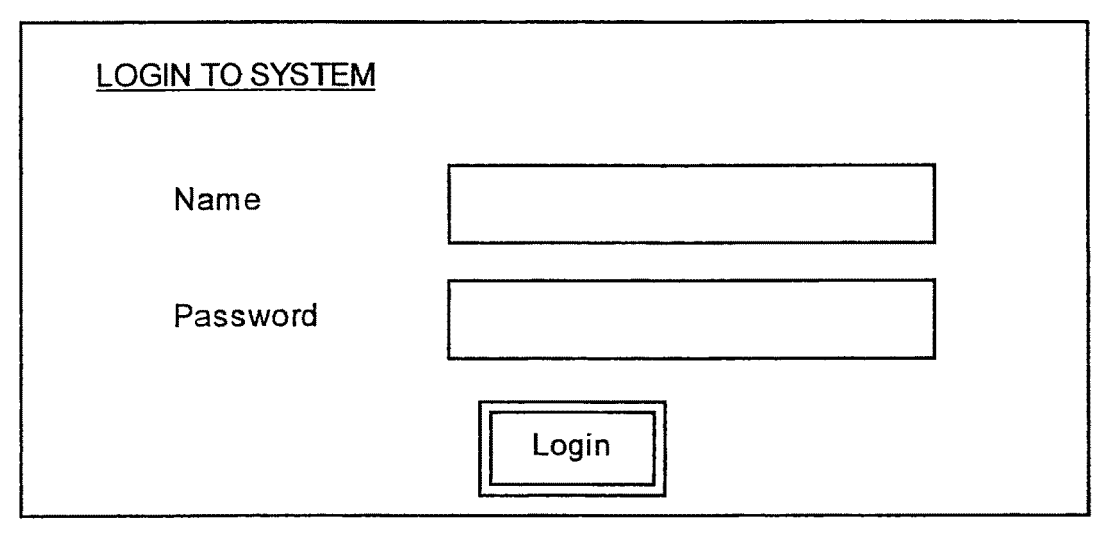

When the Web client Web client 100 accesses the concurrent development system 200 of the ASIC and the FPGA, the Web server 220 sends the display control data for the login screen shown in FIG. 17 to the Web client 100, and the Web client 100 displays the screen based on the received data. When the user inputs the user name and the password registered on the login screen based on the matching and presses a login button, the Web client 100 sends the user name and the password to the Web server 220.

The Web server 220 refers the received user name and password to the user authentication server 230. The user authentication server 230 confirms whether the user name and the password are registered (step S501), and returns the result to the Web server 220. When rejected by the user authentication server 230, the Web server 220 sends the display control data for a login rejection screen to the Web client 100, and the Web client 100 displays the login rejection on the screen based on the received data and finishes the processing (step S502).

Figure 18:
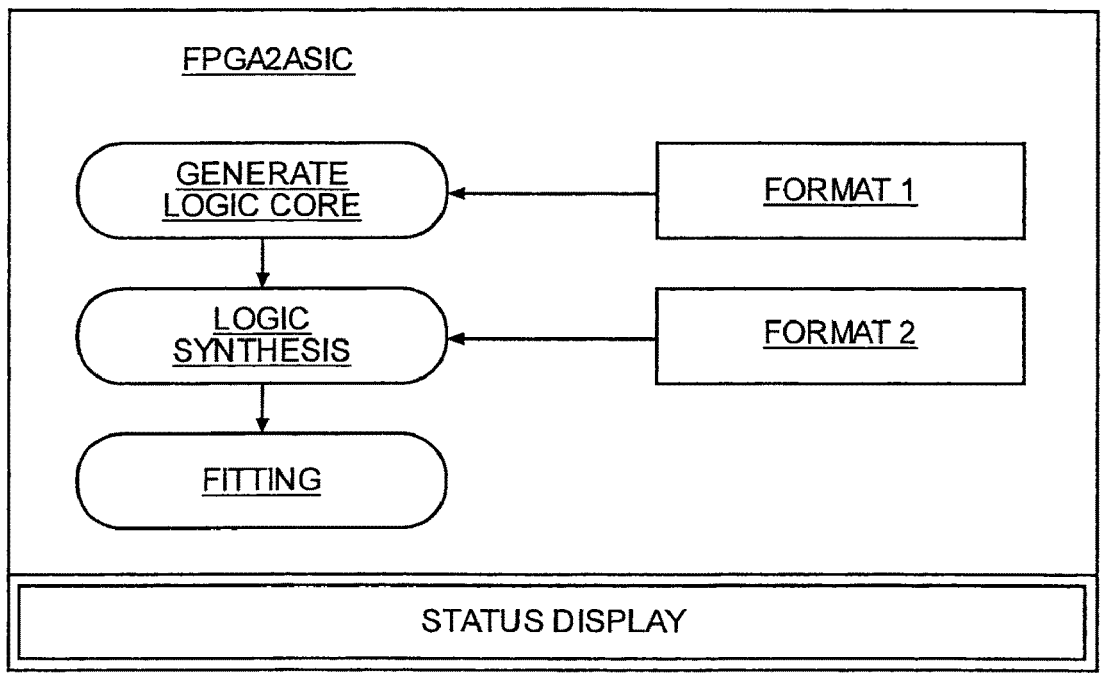
FIG. 18 is one example of a procedure screen.

If the user authentication server 230 accepts the user name and the password, the Web server 220 sends the display control data for a procedure screen shown in FIG. 18 to the Web client 100, and the Web client 100 displays the procedure screen based on the received data (step S503).

The user selects a menu from the procedure screen shown in FIG. 18, to perform concurrent development of the ASIC and the FPGA. If the user selects "format 1" and "format 2" (Yes at step S504), a format file required for the target design is downloaded from the Web server 220 to the Web client 100 (step S505).

The "format 1" is format data of the table for generating the logic CORE, as shown in FIG. 15. The "format 2" is format data of a table defining terminal names and terminal number assignment for the ASIC package used in the logic synthesis of the ASIC, and the I/O buffer for electrically interfacing between the ASIC and external devices.

If the user selects logic CORE generation (Yes at step S506), the Web client 100 sends information indicating that logic CORE generation has been selected to the Web server 220, and the Web server 220 activates the logic CORE generating interface program 221 (step S507).

If the user selects logic synthesis (Yes at step S508), the Web client 100 sends information indicating that logic synthesis has been selected, and the Web server 220 activates the logic synthesis interface program 222 (step S509).

If the user selects fitting (Yes at step S510), the Web client 100 sends information indicating that fitting has been selected to the Web server 220, and the Web server 220 activates the fitting interface program 223 (step S511).

If the user selects status display (Yes at step S512), the Web client 100 sends data to the Web server 220 informing that the status display has been selected, and the Web server 220 activates the status display interface program 224 (step S513).

A process procedure for the logic CORE generating interface program 221 will be explained next with reference to the flowchart in FIG. 19. The logic CORE generating interface program 221 sends the display control data for the logic CORE generating interface screen shown in FIG. 20 to the Web server 220. The Web server 220 sends the received display control data for the logic CORE generating interface screen to the Web client 100. The Web client 100 displays the logic CORE generating interface screen based on the received display control data for the logic CORE generating interface screen (step S801).

The user inputs a project name and presses "execute" button, to thereby specify a file of the logic CORE generation table shown in FIG. 15, in which the IO specification of the functional block constituting the ASIC for generating the ASIC logic CORE is defined, based on a file selection screen displayed by the Web client 100.

The Web client 100 sends the project specification data and the file of the IO logic CORE generation table to the Web server 220. The Web server 220 creates directories such as IO 42, CORE 43, RTL 44, SYNTHESIS 45, ROM 46, and LAYOUT 47 (shown in FIG. 14) in the file server 270 (step S802), stores the files of the logic CORE generation table in the directory ASIC 48 under the IO 42, specifies the project name, executes the ASIC logic CORE generator program 251, and stores an execution process ID in the memory (step S803).

Figure 21:
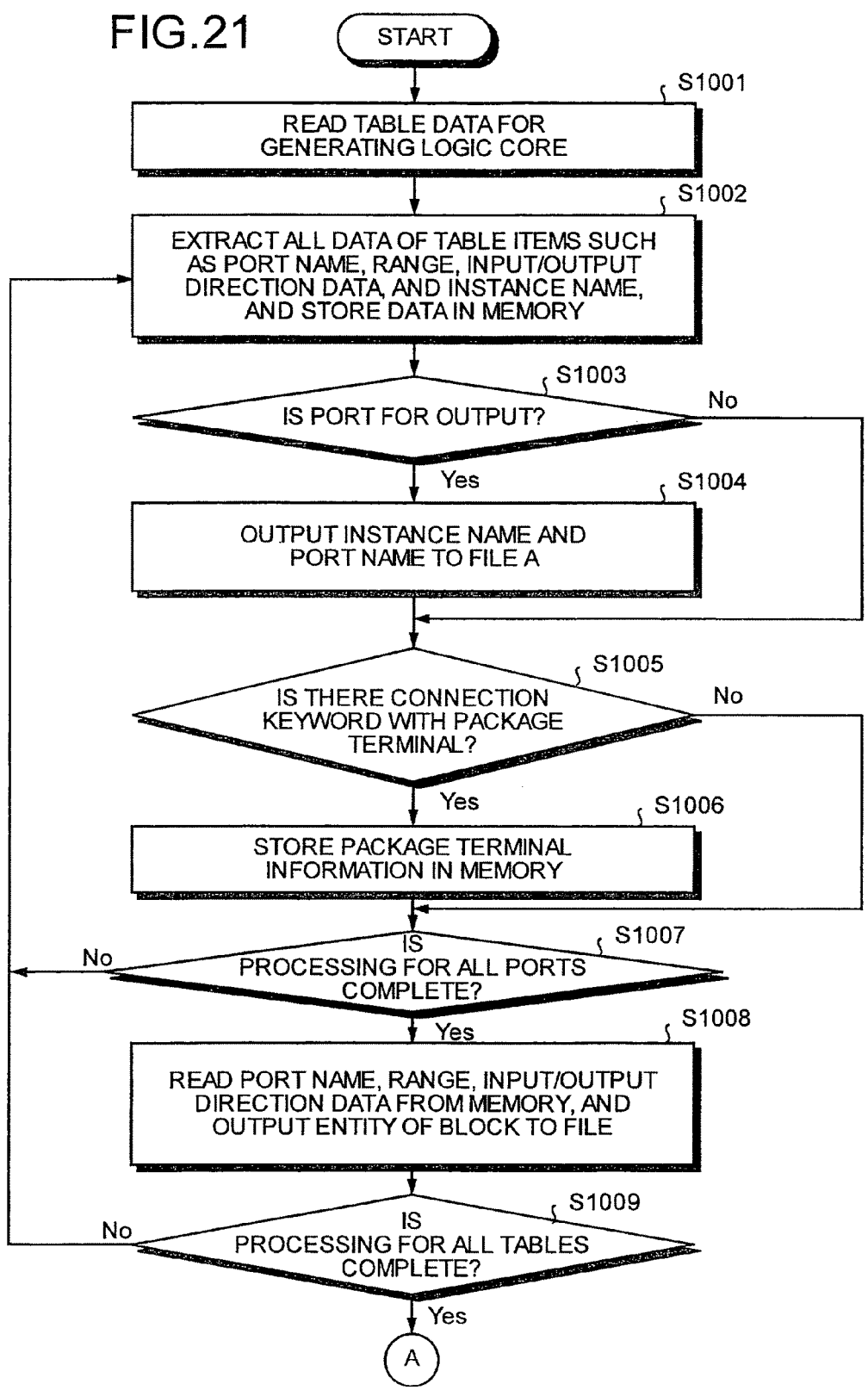
FIG. 21 is a flowchart (1) of a process procedure for an ASIC logic CORE generator program.

The process procedure for the ASIC logic CORE generator program 251 is explained next with reference to flowcharts in FIGS. 21 and 22. As shown in FIG. 21, the ASIC logic CORE generator program 251 reads the tables X, Y, and Z for generating the logic CORE shown in FIG. 15 from the directory ASIC 48 shown in FIG. 14, to perform the process for each file one by one.

The tables X, Y, and Z for generating the logic CORE define the port specification of the functional block created based on the study of the circuit architecture according to the defined "format 1". These tables are always created when designing the functional block, and include functional block name, instance name, port name, range, input/output, type, output side instance name, and output port name of the output side instance. The instance refers to the functional block constituting the ASIC, and when a plurality of functional blocks having the same function is used, the instance names thereof are changed and incorporated.

At first, X data is read (step S1001), the whole data in the table of port A is extracted and stored in the memory (step S1002), to check if the port A is for output (step S1003). Because the port A is for input, it is checked if there is a connection keyword "IO" with the package terminal (step S1005). Because there is no keyword "IO", the whole data of the port B is stored in the memory.

Because the port B is for output, "XB" is output in a file name A to the directory ASIC 50 in FIG. 14 (step S1004). Because there is no connection keyword "IO" with the package terminal, the whole data of the next port Z is stored in the memory. Because the port Z is for output, "XZ[2:0]" is output to the file A. Because there is no connection keyword "IO" with the package terminal, the whole data of the next port I is stored in the memory.

Since the port I is for input, and there is the connection keyword "IO" with the package terminal, "INPUT, in, 2:0" is stored in the memory as the port name of the logic CORE (step S1006). The processing of all ports in X is complete (Yes at step S1007), and the entity file defining the port name, input/output, and range information is output to the directory ASIC 50 in FIG. 14, in a name of X, according to the grammar of the HDL (step S1008). In the case of VHDL, the contents to be output are as follows:

A: in std_logic;
B: out std_logic;
Z: out std_logic_vector (2 down to 0);
I: in std_logic.

The above processing is also performed for the data in Y and Z. At this stage, the following data is recorded in the file A.

XB, XZ[2:0], YC[1:0], YO, ZF

When the processing of all tables in the X, Y, and Z is complete (Yes at step S1009), the data in the file A is read (step S1010), and stored in the memory (step S1011). This processing is performed for each file one by one. The table data in X will be explained here as an example. At first, it is checked if the port A is for input (step S1012). Because the port A is for input, Y on the output side and C as the port name are extracted (step S1013). YC[1:0] is then searched in the memory (step S1014), to check if there is matching data (step S1016). Because the matching data is found in the memory, the following connection information is output in a file name B in the directory ASIC 50 (step S1018).

A=>YC

When there is no matching data, error information indicating that the port name or the range is different is output to the log file in the directory ASIC 50 (step S1017).

Likewise, because the port B is for output, the following connection information is output to the file B in the directory ASIC 50 (step S1015).

B=>XB

Likewise, because the port Z is for output, the following connection information is output to the file B in the directory ASIC 50.

Z=>XZ

Because the port I is for input, and "IOINPUT" cannot be found by the search, error information is output to the log file in the directory ASIC 50. However, in the case of the port connected to the package terminal, it is not a problem, and on the contrary, it can be confirmed which port in which instance is connected to which terminal of the package from the error information output to the log file. The following connection information is then output to the file B in the directory ASIC 50.

I=>IOINPUT

When the above process has finished for the table data in Y and Z (Yes at step S1019), a port for which the connection information cannot be created is output to the log file (step S1020), and in the case of VHDL, the entity file of the ASIC logic CORE having the following information is output to the directory ASIC 50 (step S1021).

Figure 19:
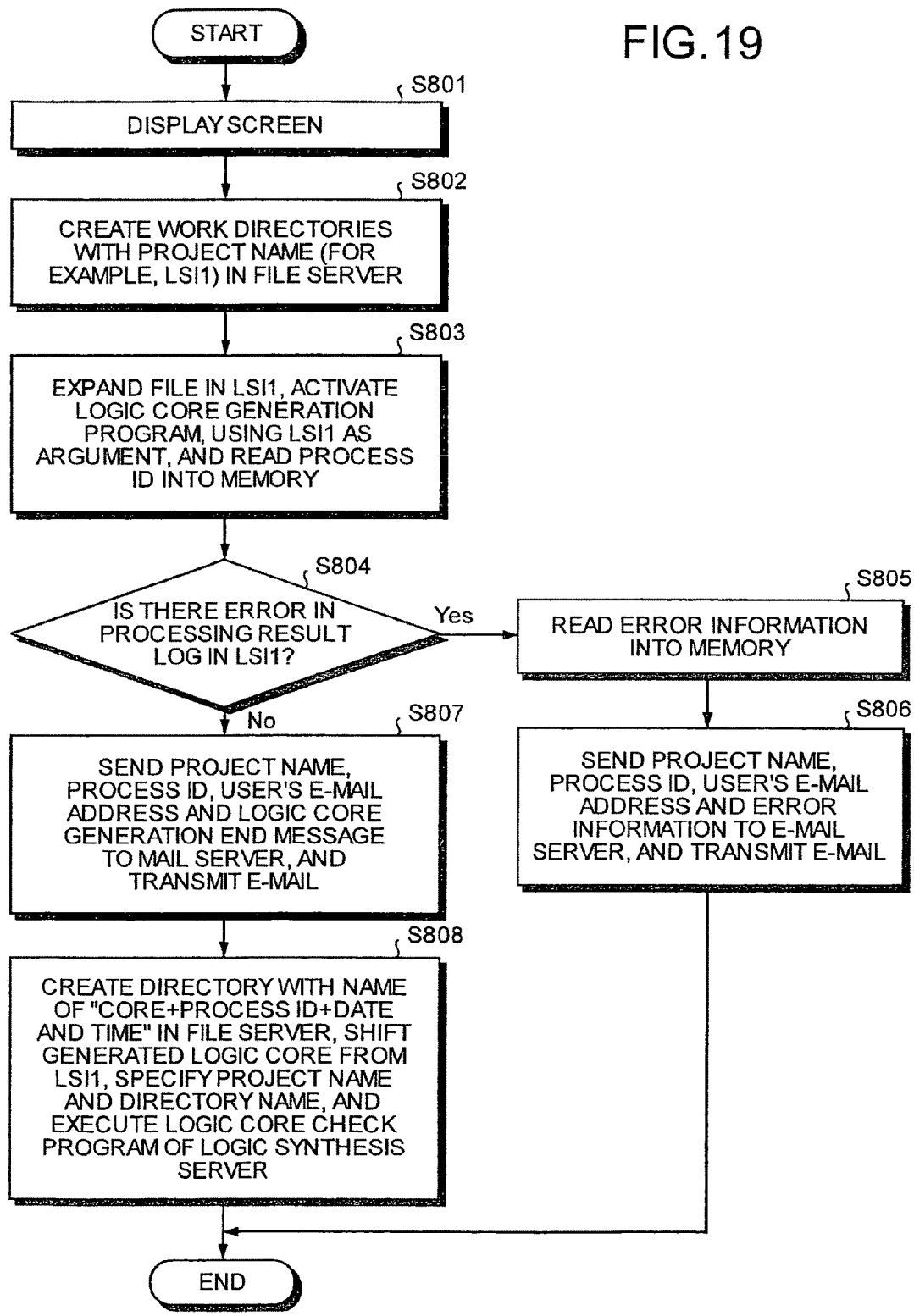
FIG. 19 is a flowchart of a process procedure for a logic CORE generating interface program.
Figure 20:
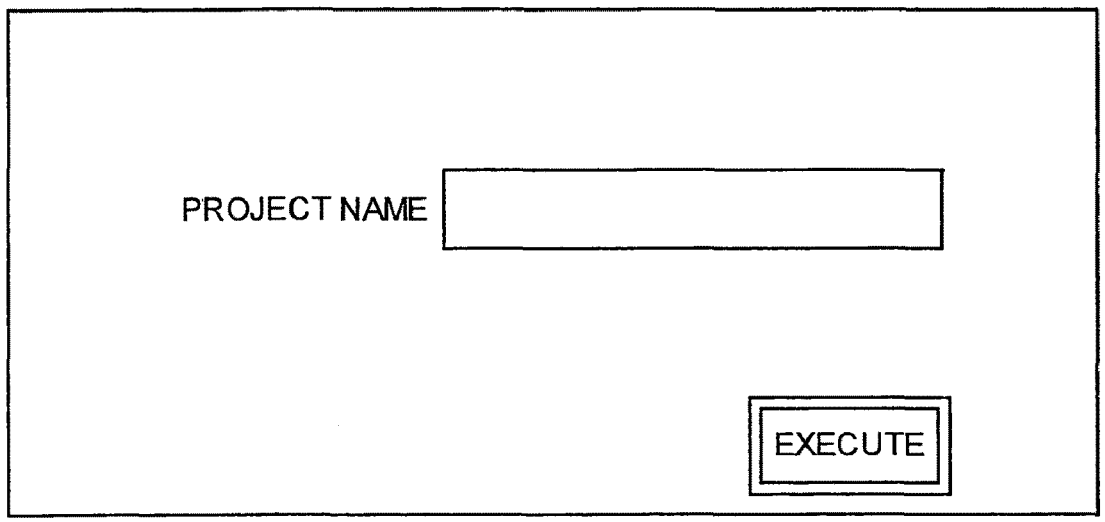
FIG. 20 is one example of a logic CORE generating interface screen.

INPUT: in std_logic;
OUT: out std_logic;

Further, the entity file of the logic CORE and the connection information are combined, and the ASIC logic CORE is output to the directory ASIC 50 in a file with a project name specified in FIG. 17 to finish the process, and control returns to the logic CORE generating interface program 221 shown in FIG. 19 (step S1022).

The logic CORE generating interface program 221 checks if there is an error in the log file in the directory ASIC 50. If an error is recorded (Yes at step S804), the error is read (step S805), the project name, the e-mail address of the user obtained by referring to the user management server 240 using the project name, the error information, and the process ID are sent to the mail server 260, and the mail server 260 transmits an e-mail to the user (step S806). The user confirms the error content by the e-mail, and repeats the processing for generating the logic CORE until there is no error.

On the other hand, if an error has not been recorded in the log file (No at step S804), the e-mail address of the user obtained by referring to the user management server 240 using the project name, the process ID, and a logic CORE generation completion message are sent to the mail server 260 (step S807), and the mail server 260 transmits an e-mail to the user.

Further, a directory is created with the name of "CORE+process ID+date and time" in the directory ASIC 50, the logic CORE created in the project name in the directory ASIC 50 and the log file are shifted to this directory, and a directory is created in this directory in the name of IO. The table data in the directory ASIC 48 used for generating the logic CORE is shifted to this IO directory, and the project name and the directory name of the logic CORE created in the name of "CORE+process ID+date and time" are specified in a logic CORE check program in the logic synthesis server 250, to activate the logic CORE check program (step S808).

In this logic CORE check program, commands of the logic synthesis tool are described so as to perform grammar check of the ASIC logic CORE, and non-connection check of the input/output port of the respective instances constituting the logic CORE, to output a report.

Figure 23:
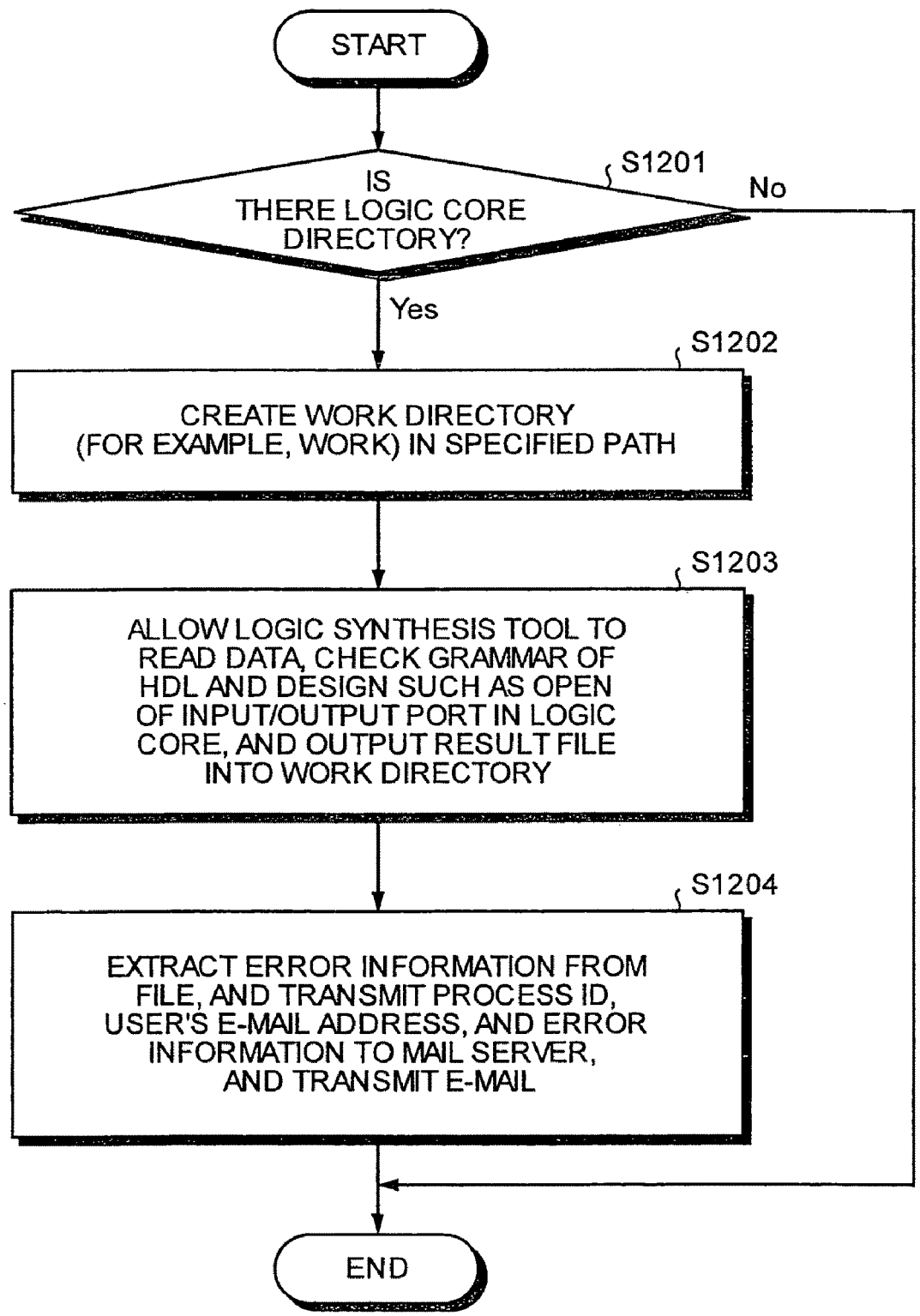
FIG. 23 is a flowchart of a process procedure for a logic core check program.

The process procedure for the logic CORE check program will be explained below with reference to a flowchart in FIG. 23. This logic CORE check program is under the received directory in the project name, wherein it is checked whether there is a directory of the target ASIC logic CORE in the directory ASIC 50 shown in FIG. 14 (step S1201), and if Yes at step S1201, a WORK directory is created in the ASIC directory including the logic CORE directory (step S1202), so that the logic synthesis tool executes checking (step S1203).

When the execution has finished, the error information is extracted from the report file in the WORK directory, and sent to the mail server 260, together with the e-mail address of the user obtained by referring to the user management server 240 using the project name and the process ID extracted from the logic CORE directory name, and the mail server 260 transmits these by e-mail to the user (step S1204). The user confirms whether the error information is an intended piece of information from the content of the transmitted e-mail.

The logic CORE generated in the series of flow ensures that the ASIC is assembled at all times, unless there is a connection error between the instances constituting the ASIC in the user's logic design. This effect appears in the logic verification. When an operation different from the expected operation is performed in the function verification of a plurality of instances constituting the ASIC, because connection between the instances is ensured, it is possible to debugging with focus on the respective functions constituting the instance.

Figure 24:
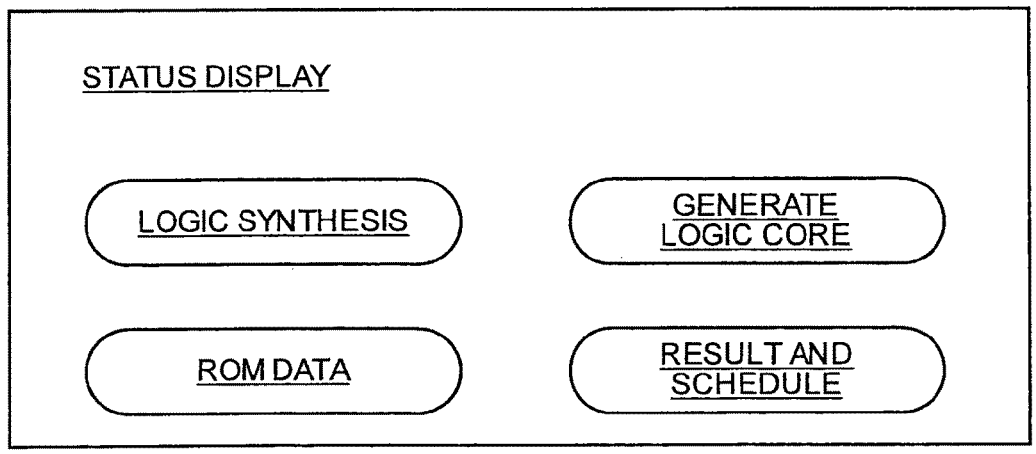
FIG. 24 is one example of a status display selection screen.

The process when the user selects status display on the procedure screen in FIG. 18 will be explained next. When the user selects status display on the procedure screen in FIG. 18, the status display interface program 224 is activated. The display control data for the status display selection screen shown in FIG. 24 is transmitted to the Web server 220. The Web server 220 transmits the received display control data for the status display selection screen to the Web client 100. The Web client 100 displays the screen based on the received display control data for the status display selection screen.

Figure 25:
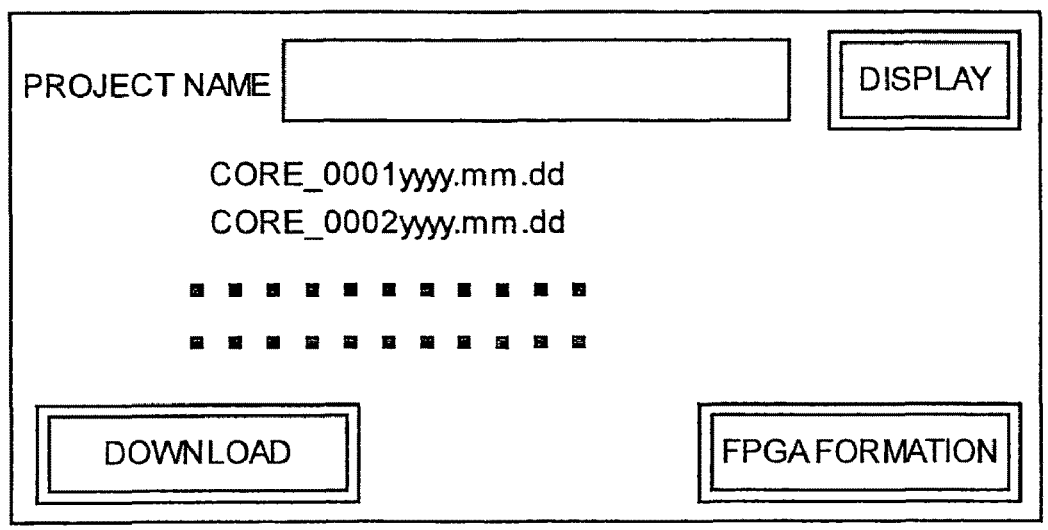
FIG. 25 is one example of a logic CORE generating status screen.

On this screen, when the user selects logic CORE generation, display control data without name display of the logic CORE on the logic CORE generating status screen shown in FIG. 25 is created by the status display interface program 224, and the display control data is transmitted to the Web server 220. The Web server 220 transmits the received display control data for the logic CORE generating status screen to the Web client 100. The Web client 100 displays the screen based on the received display control data for the logic CORE generating status screen.

On this screen, when the user inputs the project name and presses a display button, the Web client 100 sends the project name to the Web server 220. The status display interface program 224, having received the project name from the Web server 220, extracts the directory name of the logic CORE in the directory ASIC 50 in FIG. 14 from the directory having the specified project name, updates the display control data for the logic CORE generating status screen and sends the display control data to the Web server 220. The Web server 220 sends the received display control data for the logic CORE generating status screen to the Web client 100. The Web client 100 displays the screen based on the received display control data for the logic CORE generating status screen. On this screen, the directory name of the ASIC logic CORE generated previously is displayed.

Figure 26:
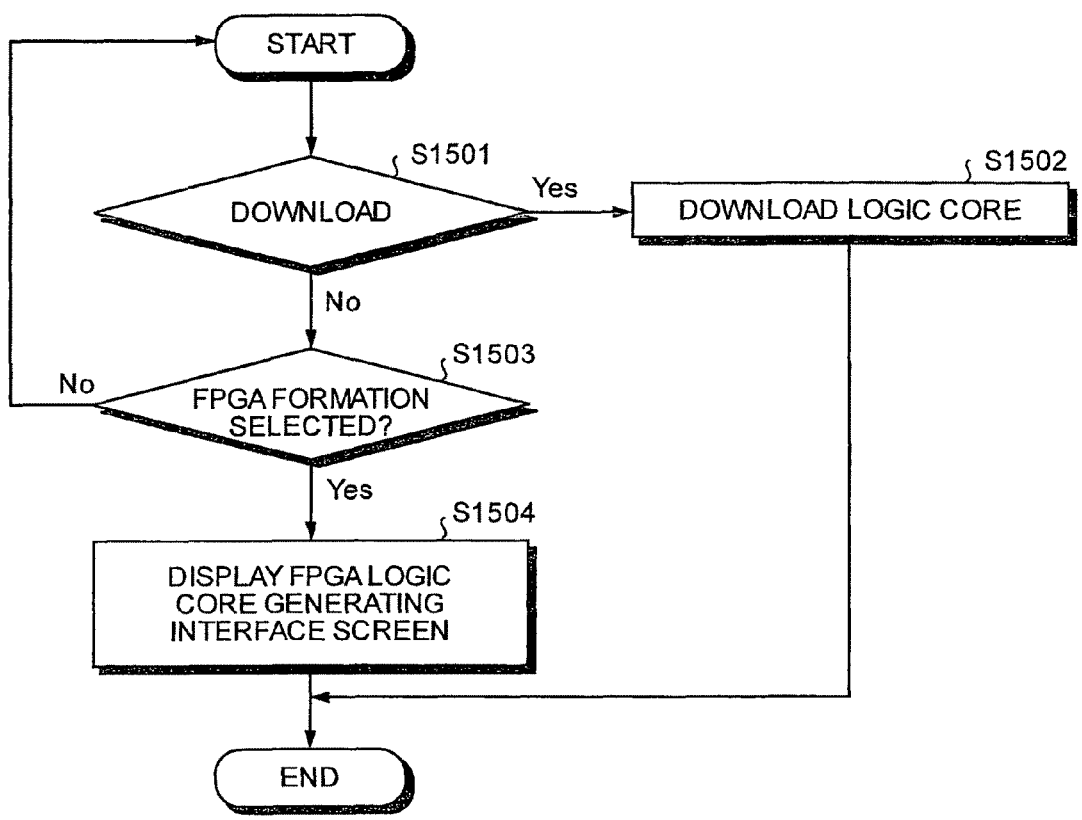
FIG. 26 is a flowchart of a process procedure on the logic core generating status screen of the ASIC.

The process procedure on the ASIC logic CORE generating status display screen will be explained next, with reference to the flowchart in FIG. 26. If the user selects any of the displayed logic COREs and selects download (step S1501), the target logic CORE can be downloaded to the Web client 100 (step S1502). The downloaded logic CORE can be used for logic verification as a netlist of the ASIC chip level, and hence it is possible to debug with focus on the respective functions constituting the instance.

Figure 27:
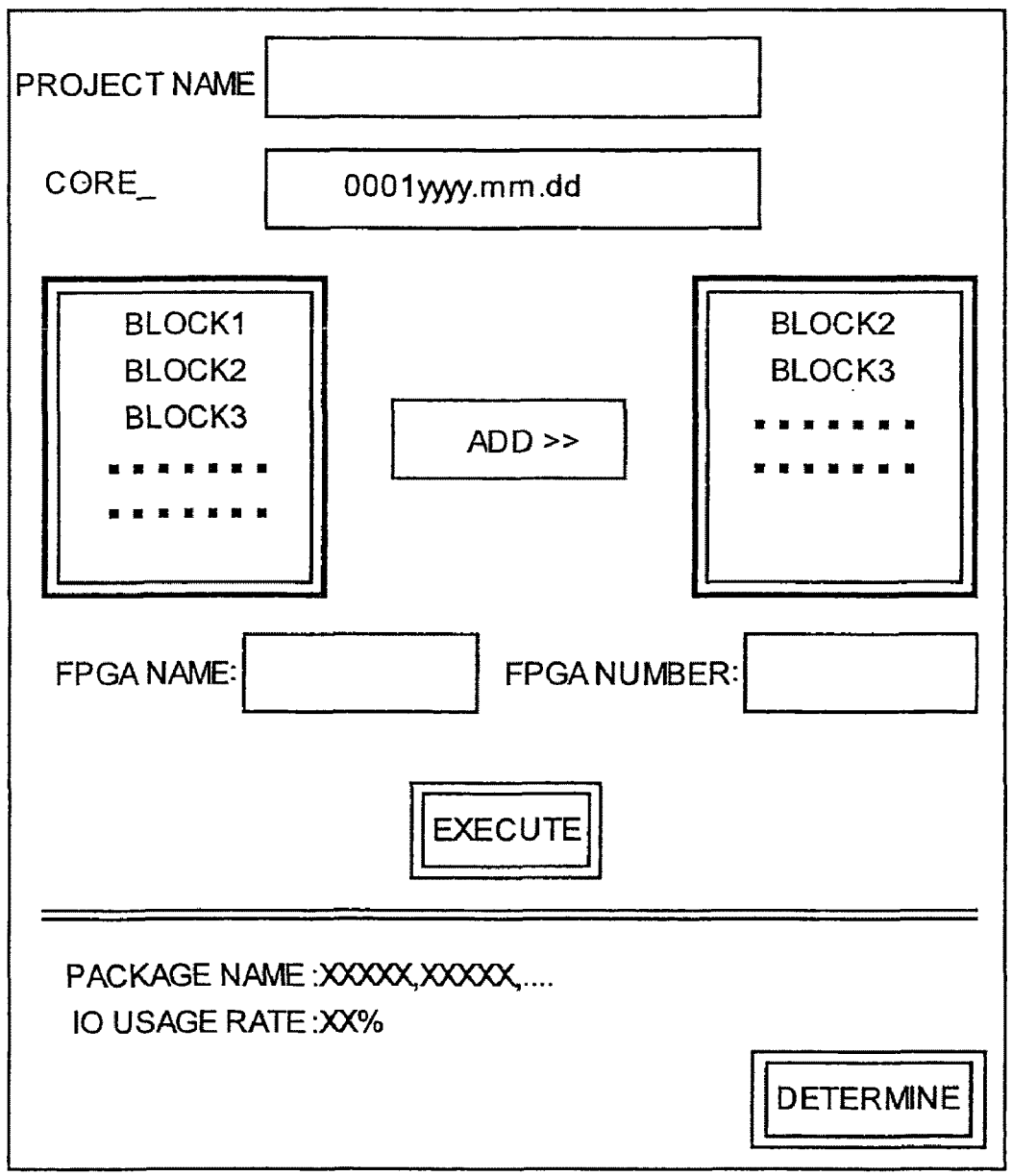
FIG. 27 is one example of an FPGA logic CORE generating interface screen.

On the other hand, if the user specifies the logic CORE name and selects an FPGA formation button (step S1503), the Web client 100 sends data to the Web server 220 informing the project name, the logic CORE name, and that the FPGA formation button has been selected, and the Web server 220 sends the received data to the status display interface program 224. The status display interface program 224 extracts a file name of the table data in the IO directory under the directory having the target logic CORE name, and the display control data for the FPGA logic CORE generating interface screen as shown in FIG. 27 is created and sent to the Web server 220.

The Web server 220 sends the received display control data for the FPGA logic CORE generating interface screen to the Web client 100. The Web client 100 displays the screen based on the received display control data for the FPGA logic CORE generating interface screen (step S1504). On this screen, the specified project name, the logic CORE name, and a list of instance names constituting the logic CORE are listed in a list box on the left side. On this screen, the target logic CORE can also be changed, and when the user specifies the project name and the logic CORE name, the screen is updated according to the process similar to that shown in FIG. 25.

Further, the screen is an interface for generating the FPGA logic CORE from the table data of the instance constituting the logic CORE of the target ASIC, and the user specifies an instance from the left list box and selects an "add" button, to add the instance in the right list box. The instance listed in the right list box becomes one FPGA. When the user selects an instance, sets an FPGA name, and an FPGA number that is a sequential number for management and a unique integer equal to or larger than 1, and presses an "execute" button, the Web client 100 sends the target project name, the ASIC logic CORE name, the FPGA name, a list of instance names to be formed into FPGA, and the FPGA number to the Web server 220. The Web server 220 then sends the received data to the status display interface program 224.

The status display interface program 224 creates a directory with the specified FPGA number in the directory FPGA 49 shown in FIG. 14, according to the received list of the instance names, and copies the table data matching with the name into the directory of the number from the IO directory under the directory having the CORE name in the directory ASIC 50 in FIG. 14. The FPGA logic CORE generator program 252 is then executed by using the list of the table data names as an argument.

Figure 28:
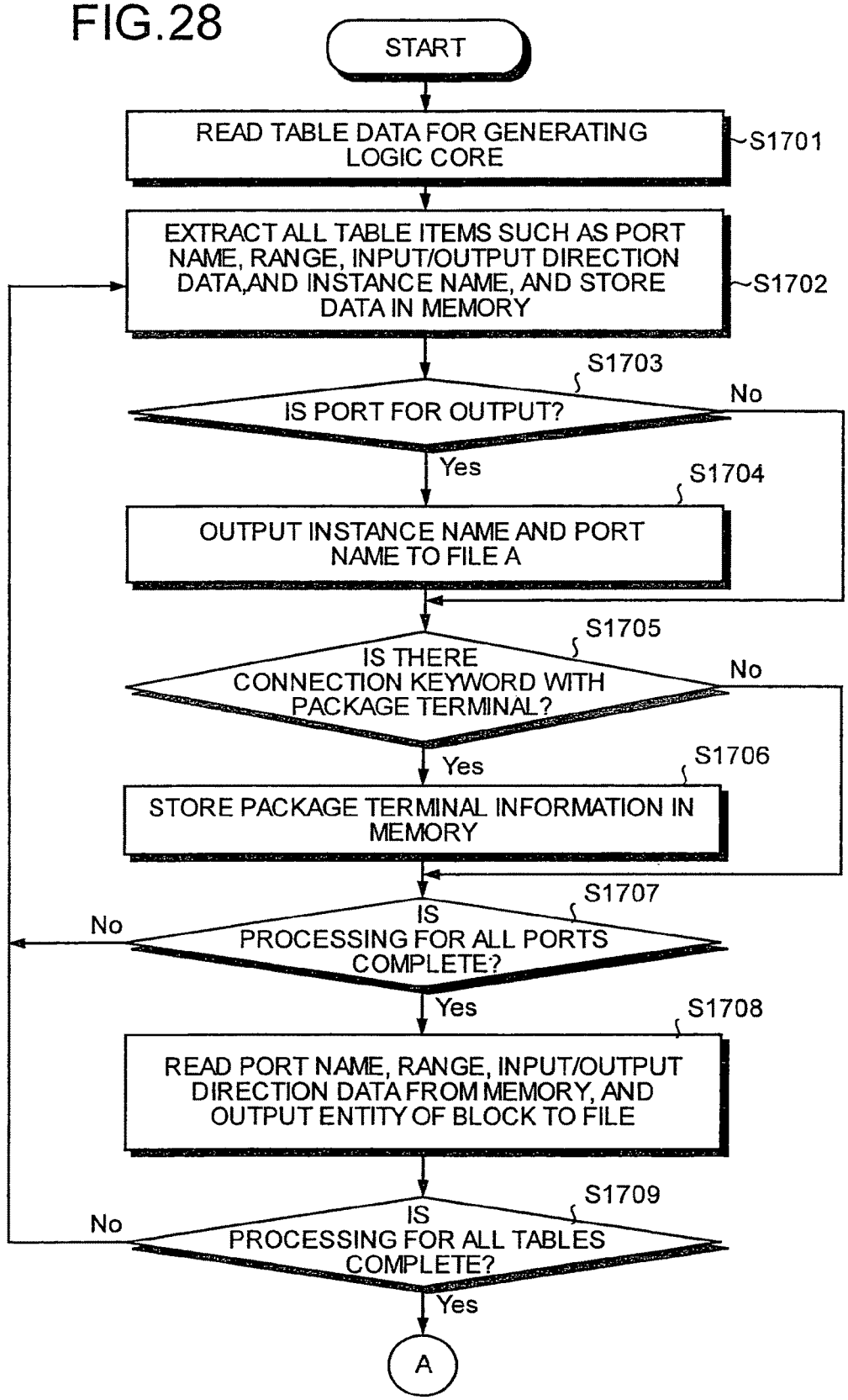
FIG. 28 is a flowchart (1) of a processing procedure for an FPGA logic CORE generator program.
Figure 29:
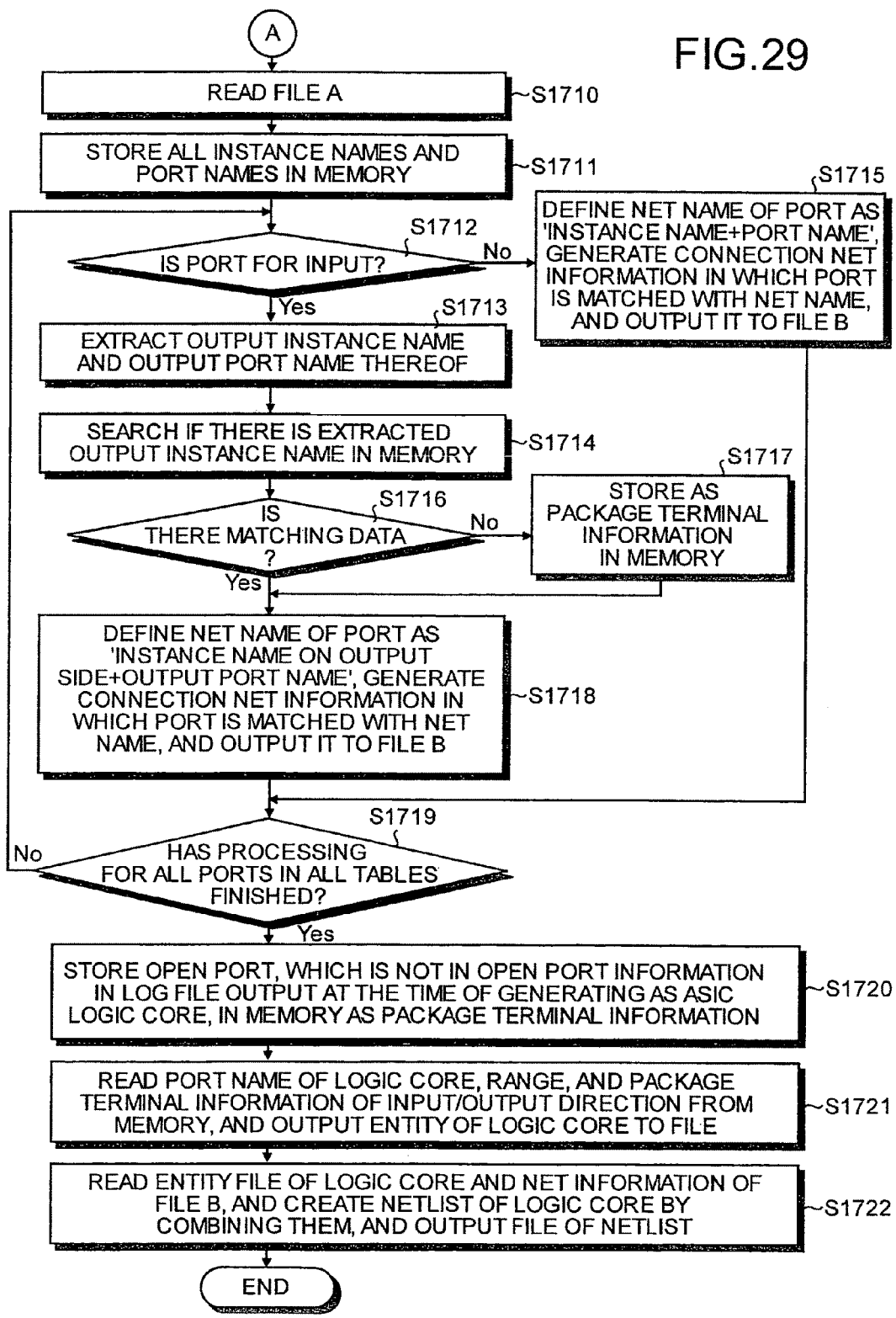
FIG. 29 is a flowchart (2) of a processing procedure for the FPGA logic CORE generator program.

The process procedure for the FPGA logic CORE generator program 252 will be explained below with reference to flowcharts in FIGS. 28 and 29. The processing in FIG. 28 is the same as that shown in FIG. 21, and the processing in FIG. 29 is the same as that shown in FIG. 22, except of step S1717 and step S1720. Therefore, only these two steps will be explained.

Figure 22:
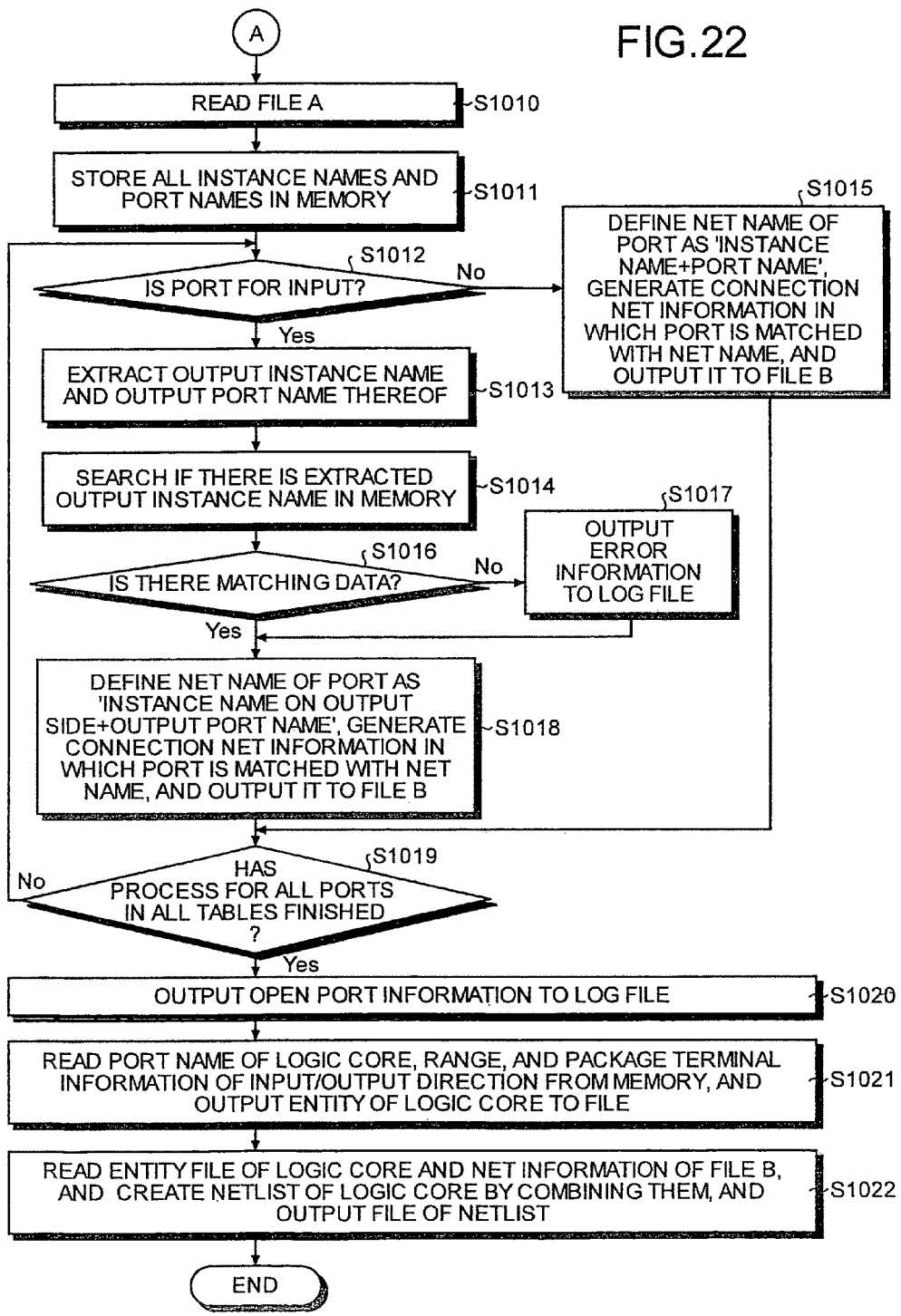
FIG. 22 is a flowchart (2) of a processing procedure for the ASIC logic CORE generator program.

At step S1017 in FIG. 22, when the instance name to be connected and the output port name thereof defined in the port, being an input of the target instance, are not present in the information stored in the memory, an error message is output to the log file. However, at step S1717 in FIG. 29, because the connection between ports of the instance can be ensured essentially as the ASIC logic CORE, at step S1717, not an error message, but input terminal information of the package is added and stored in the memory.

Further, at step 1020 in FIG. 22, finally remaining unconnected port information is output to the log file. On the other hand, at step S1720, the target log file in the directory of the ASIC logic CORE created in the name of "CORE+process ID+date and time" under the directory ASIC 50 in FIG. 14 is compared with the log file output at step S1720, and an output port, which is not in the log file output at step S1020, is added and stored in the memory as the output terminal information of the package. Thereafter, in the same manner as the processing at step S1020, the logic CORE is output in a file with an FPGA name specified in the directory of the specified number under the directory FPGA 51 in FIG. 14.

The status display interface program 224 reads the FPGA logic CORE file, counts the number of terminals to be for input and output of the package, calculates all the percentage accounted for of the number of IO in the second column in a compatible package table shown in FIG. 30, extracts a package having the largest percentage and the compatible package data thereof, updates the screen display control data having the package name and the IO usage rate for the FPGA logic CORE generating interface screen shown in FIG. 27 and sends the data to the Web server 220. The Web server 220 sends the received display control data for the FPGA logic CORE generating interface screen to the Web client 100, and the Web client 100 updates the input screen based on the received display control data for the FPGA logic CORE generating interface screen.

If not satisfied with this result, the user tries again to generate the FPGA logic CORE. If the user selects "determine" (see FIG. 27), the Web client 100 sends data indicating that "determine" has been selected and data including the FPGA number, the package name, and the IO usage rate, to the Web server 220. The status display interface program 224 having received these data from the Web server 220 creates a directory having a number specified in the directory FPGA 55 in FIG. 14, and outputs a file of the data received, for example, with a name of plist.

Figure 31:
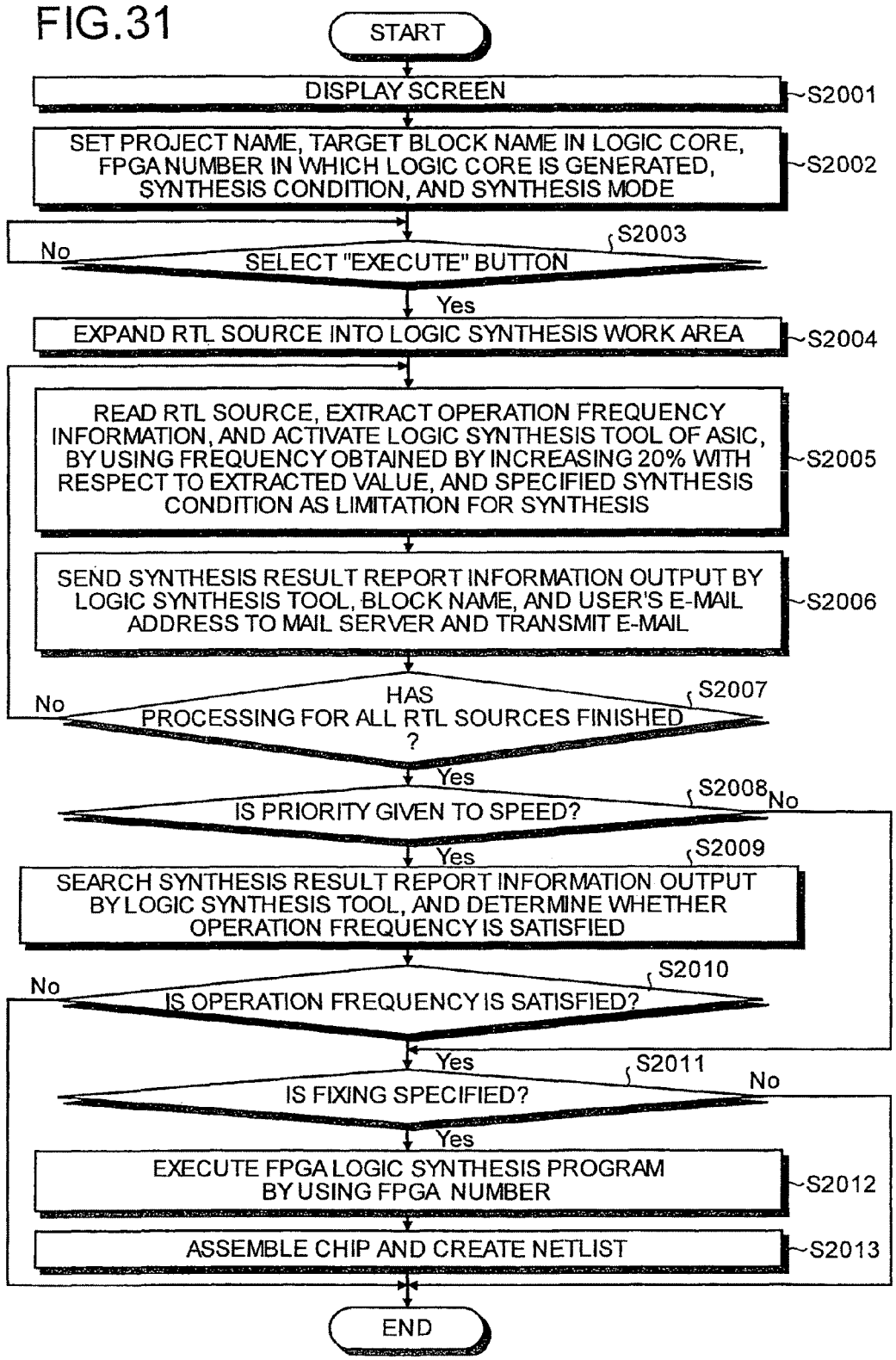
FIG. 31 is a flowchart of a process procedure for a logic synthesis interface program.

The process procedure for the logic synthesis interface program 222 will be explained. FIG. 31 is a flowchart of the process procedure for the logic synthesis interface program 222. As shown in FIG. 31, this logic synthesis program 222 sends display control data for a logic synthesis interface screen as shown in FIG. 32 to the Web server 220. The Web server 220 sends the received display control data for the logic synthesis interface screen to the Web client 100, and the Web client 100 displays the screen based on the received display control data for the logic synthesis interface screen (step S2001).

When the user specifies a project name, a target logic CORE name displayed in FIG. 25, a functional block name to be logic synthesized, and the number of the FPGA to be incorporated, and selects whether to give priority to the area or speed, and whether to Debug (logic synthesis of the FPGA is not executed) or Fix (logic synthesis of the FPGA is executed) (step S2002), and presses the "execute" button (step S2003), the Web client 100 displays a data selection screen.

When the user selects an RTL source to be logic synthesized according to this screen, the Web client 100 sends these data to the Web server 220. The logic synthesis interface program 222, having received the data from the Web server 220, creates a directory for the RTL source with a name of the specified functional block name in the directory ASIC 52 in FIG. 14, and stores the RTL (step S2004). The RTL source is then read one by one, to extract operation frequency specified by the user in the header portion where a change history in the RTL source and the engineering level are described, and the functional block name to be logic synthesized is specified, by using a frequency obtained by increasing 20% with respect to the extracted value, and a logic synthesis condition of giving priority to the speed or area specified by the user as a limitation for logic synthesis, to execute the ASIC logic synthesis program 253 of the ASIC logic synthesis tool (step S2005).

When the ASIC logic synthesis has finished, the logic synthesis interface program 222 sends a report file output to the directory of the specified functional block under the directory ASIC 54 in FIG. 14 by the ASIC logic synthesis program 253, the user's e-mail address obtained by referring to the user management server 240 by the project name, and the block name to the mail server 260, and the mail server 260 transmits an e-mail to the user (step S2006).

The logic synthesis interface program 222 then executes this processing process with respect to all RTL sources present in the directory created in the specified functional block name under the directory ASIC 52 in FIG. 14. When the logic synthesis for all RTL sources has finished (Yes at step S2007), the logic synthesis interface program 222 searches a report of the logic synthesis results for all RTL sources when priority is given to the speed being specified (Yes as step S2008), and determines whether the operation frequency defined in the RTL source is satisfied (steps S2009 to S2010). When priority is given to the area being specified, nothing is performed.

It is checked if Fixing is specified (step S2011), and if Fixing is specified, the logic synthesis interface program 222 creates a directory with the specified FPGA number under the directory FPGA 55 in FIG. 14, copies and stores the RTL in the specified functional block directory under the directory ASIC 52 in FIG. 14 therein, and executes the FPGA logic synthesis interface program using the specified project name and the FPGA number as arguments (step S2012).

The logic synthesis interface program 222 activates the logic synthesis tool, inputs a command to the logic synthesis tool to read the ASIC logic CORE from the specified logic CORE directory in the directory ASIC 50 in FIG. 14, and reads a file defining ASIC package terminal assignment uploaded by the user and existing in the directory ASIC 54 in FIG. 14, and a buffer electrically interfacing with an external device connected to the ASIC. A command is input to the logic synthesis tool according to the definition, to insert the ASIC buffer and a test circuit such as a scan between the terminal of the ASIC logic CORE and a pad of a chip connected to the package terminal and to connect these. The data of the functional block in all directories under the directory ASIC 52 in FIG. 14, which has been logic synthesized, is read by inputting a command to the logic synthesis tool and inserted in the logic CORE, to create a netlist of the ASIC for layout designing, and is then output in a file with a project name to the directory ASIC 54 in FIG. 14 (step S2013).

Figure 33:
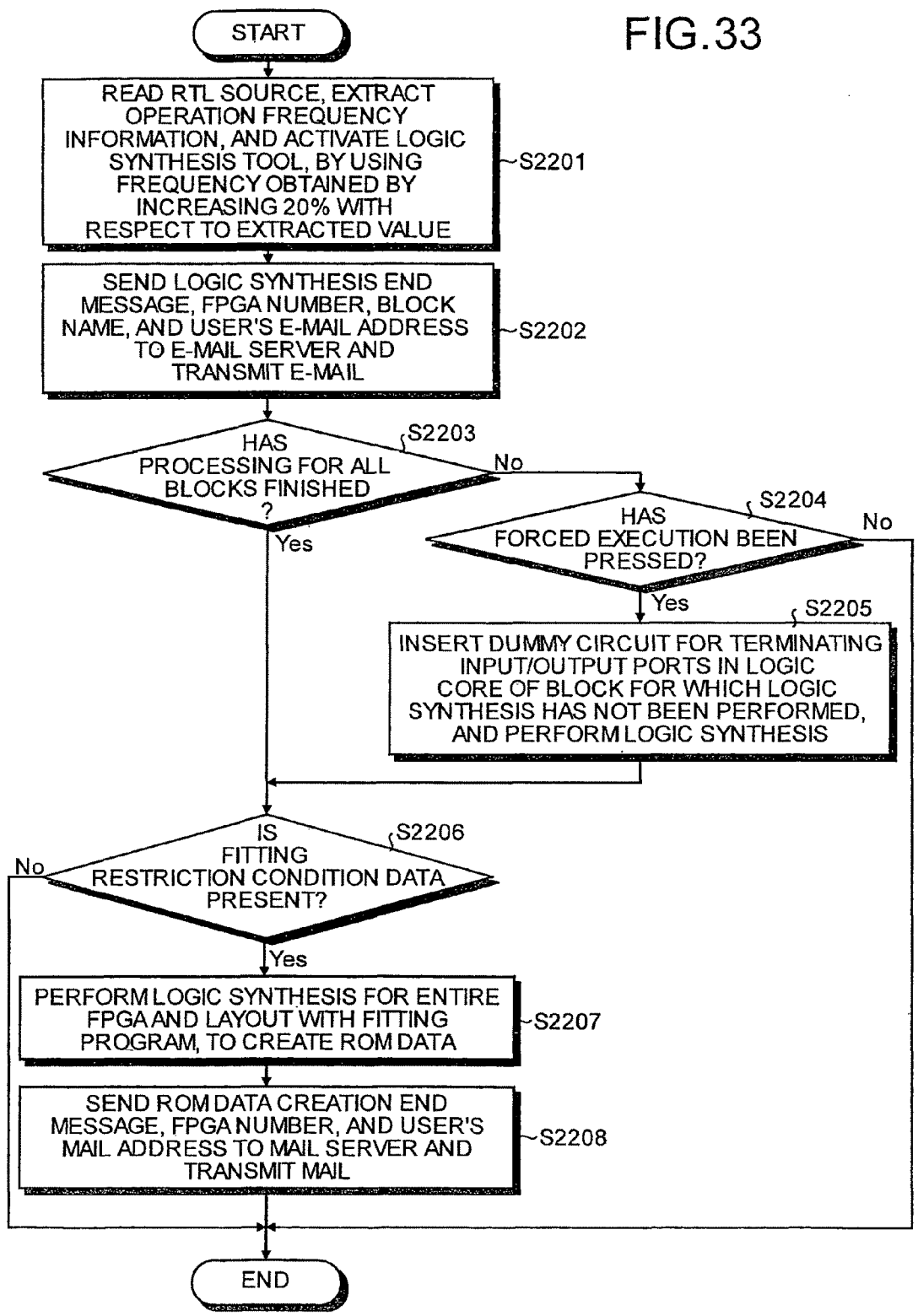
FIG. 33 is a flowchart of an FPGA logic synthesis interface process procedure.

The process procedure for the FPGA logic synthesis interface program will be explained below with reference to the flowchart in FIG. 33. The FPGA logic synthesis interface program creates a directory with an FPGA number specified by the ASIC logic synthesis interface program in the directory FPGA 55 in FIG. 14. The RTL source in the directory of the specified number under the directory FPGA 53 in FIG. 14 is read one by one, to extract operation frequency data defined by the user in the header portion where a change history in the RTL source and the engineering level are described. The functional block name to be logic synthesized is specified using a frequency obtained by increasing 20% with respect to the extracted value, to execute the FPGA logic synthesis program 254 of the FPGA logic synthesis tool (step S2201).

When FPGA logic synthesis has finished, the FPGA logic synthesis program 254 outputs the logic synthesis result to the directory of the relevant number in the directory FPGA 55 in FIG. 14 in the name of the functional block. The user can proceed with the designing work, while confirming the gate usage rate on the logic synthesis status display in FIG. 34 (described later). The FPGA logic synthesis program then sends a message to inform of the end of the logic synthesis, the FPGA number, the block name, and the user's e-mail address, obtained by referring to the user management server 240 using the project name, to the mail server 260. The mail server 260 transmits an e-mail to the user (step S2202).

The FPGA logic synthesis interface program then confirms whether the logic synthesis of all functional blocks constituting the FPGA of the specified number has finished (step S2203). This confirmation is performed by extracting the functional block name in the directory of the relevant number in the directory FPGA 51 in FIG. 14, and comparing with the functional block name for which the logic synthesis has finished. If there is no difference, the FPGA logic synthesis interface program extracts a file name of the logic CORE, being the FPGA name in the directory of the relevant number in the directory FPGA 51 in FIG. 14, and checks whether a fitting control file defining correspondence between a package terminal name, being the same as the port name of the FPGA logic CORE to be used for fitting, and the terminal number, and operation frequency, being the FPGA layout, is uploaded by the user and is present in the directory FPGA 55 in FIG. 14 (step S2206).

If the file is present, the FPGA logic synthesis interface program specifies all functional blocks constituting the FPGA, and the FPGA logic CORE in the directory of the relevant number under the directory FPGA 51 in FIG. 14, to execute the FPGA logic synthesis program 254. After the logic synthesis of the FPGA, the FPGA logic synthesis interface program activates the fitting program 255, inputs the netlist obtained as the logic synthesis result to the fitting program 255 to perform layout, creates ROM data recording the circuit information, being the layout result of the FPGA, and outputs the ROM data in the FPGA name to the directory of the relevant number under the directory ROM 46 in FIG. 14 (step S2207). The FPGA logic synthesis interface program then sends an ending message of ROM data creation, the FPGA number, the project name, and the user's e-mail address obtained by referring to the user management server 240 to the mail server 260, to transmit the e-mail (step S2208).

If the logic synthesis of all functional blocks constituting the FPGA of the specified number has not finished (No at step 2203), it is determined whether the fitting data has been input and the "execute" button has been pressed on the execution screen (step S2204), and if the "execute" button has not been pressed, the process terminates. However, if the "execute" button has been pressed, HDL description instructing to connect a flip-flop to all input and output ports, connect all output ports in the flip-flop on the input side to a suitable gate, for example, an input port of two-input NAND, connect the output of all NAND gates to an input port of a new two-input NAND gate, and repeat such a multistage connection of the two-input NAND, to connect the output of the two-input NAND on the last stage to input ports of all flip-flops on the output side, within the respective functional blocks in the FPGA logic CORE in the directory of the relevant number under the directory FPGA 51 in FIG. 14, is inserted into all functional blocks for which logic synthesis has not been performed, so that logic synthesis can be performed (step S2205).

Thereafter, the steps 2206 onwards are executed. Depending on the verification strategy at the time of starting the development, when the functional block has a configuration such that it can be functionally divided largely into upward and downward by the circuit architecture study, and when the design of the upward function has been completed by inserting a dummy circuit using a flip-flop or the like, verification is possible even if the design of the downward function has not been completed, thereby considerably contributing to improvement of the verification efficiency.

A logic synthesis status display screen shown in FIG. 34 will be explained below. When a user selects logic synthesis on the status display screen shown in FIG. 24 using the Web client 100, the Web client 100 sends information indicating that logic synthesis has been selected to the Web server 220. The status display interface program 224, having received data from the Web server 220, extracts a gate size from the logic synthesis result in the directories of all numbers under the directory FPGA 55 shown in FIG. 14, with respect to all project names obtained by referring to the user management server 240, with the name of the user who logged in.

The status display interface program 224 then extracts package information from the plist in the same directory generated by the FPGA logic CORE generation explained above, selects a package in which the percentage of the gate size becomes 75% or less in the table shown in FIG. 30, based on the package information, creates display control data for the logic synthesis status display screen in FIG. 34, and sends the data to the Web server 220. The Web server 220 sends the display control data for the logic synthesis status display screen to the Web client 100, and the Web client 100 displays the screen based on the received display control data for the logic synthesis status display screen.

The reason for selecting a package in which the percentage of the gate size is 75% or less will be briefly explained. Normally, the FPGA logic synthesis tool suggests a suitable package and the gate usage rate from the database included in the logic synthesis tool, based on the gate size in the logic synthesis result. However, in fitting of the FPGA, a unit block in which the logic is realized by the FPGA, is used for wiring to increase the wiring efficiency in a cell arranging process. Therefore, 75% is set so that the gate usage rate does not exceed 100% after fitting, which may differ between FPGAs, taking into consideration that the gate size becomes larger than that of the logic CORE result. Accordingly, it is effective to execute the FPGA logic synthesis for each functional block.

Input of the fitting data and the execution screen will now be explained. FIG. 35 is one example of an input and execution screen of fitting data. When the user selects fitting on the procedure screen shown in FIG. 18 by using the Web client 100, the Web client 100 sends information indicating that fitting has been selected to the Web server 220. The fitting interface program 223, having received the data from the Web server 220, extracts numbers and names of all directories under the directory FPGA 55 in FIG. 14 and a file name of the netlist, that is, the FPGA name, being the logic synthesis result, in the respective directories, with respect to all project names obtained by referring to the user management server 240 by the name of the user who logged in, creates display control data for the input and execution screen of the fitting data shown in FIG. 35, and sends the display control data to the Web server 220.

The Web server 220 sends the display control data for the input and execution screen of the fitting data to the Web client 100, and the Web client 100 displays the screen based on the received display control data for the input and execution screen of the fitting data. When condition data input is selected on this screen, the Web client 100 displays a data selection screen.

According to this screen, when the user selects fitting control file, the Web client 100 sends the selected FPGA number and the fitting control file to the Web server 220, and the fitting interface program 223, having received the data from the Web server 220, stores the fitting control file in the directory of the relevant number under the directory FPGA 55 in FIG. 14.

When the user selects the "execute" button, the Web client 100 sends information indicating the selected FPGA number, the project name, and that execution has been selected, to the Web server 220. The fitting interface program 223, having received data from the Web server 220, executes the FPGA logic synthesis interface program by using the project name and the FPGA number as arguments. The process for the FPGA logic synthesis interface program is as explained above.

A ROM data generating status screen will be explained below. FIG. 36 is one example of the ROM data generating status screen. When the user selects ROM data on the status display selection screen shown in FIG. 24 by using the Web client 100, the Web client 100 sends information indicating that ROM data has been selected, to the Web server 220.

The status display interface program 224, having received data from the Web server 220, extracts numbers and names of all directories under the directory ROM 46 in FIG. 14, and a ROM data name, that is, the FPGA name, being the fitting result in the respective directories, with respect to all project names obtained by referring to the user management server 240 by the name of the user who logged in, creates display control data for the ROM data generating status screen shown in FIG. 36, and sends the display control data to the Web server 220.

The Web server 220 sends the display control data for the ROM data generating status screen to the Web client 100, and the Web client 100 displays the screen based on the received display control data for the ROM data generating status screen. The user clicks a date part of the target FPGA on this screen, to download the ROM data.

The process of the monitoring server 290 will be explained below. The monitoring server 290 monitors whether there is any change in the RTL, the time required for by logic synthesis, fitting, and the layout designing tool, and the manual operation time required for reflecting the change, which is the time other than the processing time of the tool used for the implementation design based on the scale of change in the functional block defined by a designer.

There is a directory with the project name for each project in the directory LAYOUT 47 in FIG. 14 managed by the implementation designer, and the operation is performed therein. There are a LAY directory for storing layout design data, and an RTL directory for storing the RTL source in the directories with the respective project names. The RTL directory has the same directory configuration as that of the directory ASIC 52 in FIG. 14.

The monitoring server 290 monitors the LAY directory and the RTL directory. A schedule reflecting the result of adding up the time is stored with a name of schedule in the directory of the project name, and in the initial state, scheduled date of 1stRTL and scheduled date of Sign Off are set based on matching. 1stRTL is defined as an RTL for which layout designing can be started, and at this point in time, there is no probability of a large change, and about 80% of function verification has finished. Sign Off denotes the date on which the ASIC production data is to be delivered to a device vender, after completion of the layout designing of the ASIC.

FIG. 37 is one example of a schedule and result screen. In this figure, a schedule file is converted into screen display control data, and displayed by the Web client 100. In other words, when a user selects result and schedule on the status display screen in FIG. 24, the Web client 100 sends information indicating that result and schedule has been selected, to the status display interface program 224 via the Web server 220. The status display interface program 224, having received the information, converts the schedule file into the screen display control data, and sends the data to the Web client 100 via the Web server 220. The Web client 100, having received the screen display control data, displays the screen based on the screen display control data.

FIG. 38 is one example of an operation time setting file set by the layout designer. This file is stored with a name "Manual" in the same directory as the schedule file.

When it is time to monitor, the monitoring server 290 obtains the user name, the project name to which the user belongs, and the e-mail address of the user from the user management server 240. The monitoring server 290 then reads the schedule file to extract the scheduled date for the 1stRTL. When the scheduled date is after the monitoring execution date, the processing finishes without doing anything. When the scheduled date is before the monitoring execution date, the processing hereafter is executed.

At first, if there is no RTL source in the RTL directory in the directory of the project name under the LAYOUT directory managed by the implementation designer, the processing is suspended. If the RTL source is present, RTL sources in the directories of the respective blocks under the directory ASIC 52 in FIG. 14 are compared.

If there is a difference therebetween, the monitoring server 290 sends the block name having the difference, the project name, and the e-mail address of the implementation designer to the mail server 260, and these data are transmitted from the mail server 260 to the implementation designer. The implementation designer estimates the time required for reflecting the change according to the e-mail. As a result of estimation, if necessary, the implementation designer updates, adds, or deletes the time data in the schedule file.

The monitoring server 290 then extracts a block name constituting the ASIC from the ASIC logic CORE having the latest generation time under the directory ASIC 50 in FIG. 14, and stores the block name in the memory. The monitoring server 290 then extracts the logic synthesis processing time from a report file in the logic synthesis result in the directories of the respective blocks under the directory ASIC 54 in FIG. 14. When there is no report file for the block name stored previously in the memory, that is, when the logic synthesis has not yet been performed, the average of the time extracted from the existing report files is applied to calculate the total time, and the monitoring server 290 stores the total time in the memory.

If a file of the timing verification result, being the final step of the layout designing step, of the layout designing results in the directory of the project name, is present under the directory LAYOUT 47 in FIG. 14 managed by the implementation designer, the processing time is extracted from the processing result file output by the tool used in the whole process in layout designing, to calculate the total time, by adding it to the time stored in the memory before. If there is no file of the timing verification result, the time estimated and set beforehand by the layout designer in the monitoring server at the time of matching, is applied.

The monitoring server 290 calculates the total of the total time and the time set in the manual explained above to calculate the number of days, assuming 12 hours as one day, to update the schedule file, if necessary. In other words, in the initial state, there is only a scheduled date of the 1stRTL in the schedule file, and the total time is added to the scheduled date, to add the scheduled date for incorporating the change in the implementation design thereto as a reflection starting date as shown in FIG. 37.

In the next monitoring, if the reflection starting date is after the monitoring execution date, the number of days from the scheduled date for 1stRTL, being one before the reflection starting date, till the scheduled date set as the reflection starting date is set to be a comparison object. If the reflection starting date is beyond the calculated number of days required for the implementation designing, the reflection starting date is not updated. When the reflection starting date is before the monitoring execution date, the monitoring server 290 sends the e-mail addresses of the user and the implementation designer, and a message informing that it is time to start reflection, to the mail server 260. The mail server 260 transmits an e-mail to the user and the implementation designer. At this time, if the newest reflection starting date is before the monitoring execution date, and if there is no date written in the column of result date for the reflection starting date, the monitoring server 290 does not update the schedule file.

When an e-mail of acknowledgement or of rejection has arrived to the monitoring server 290 from both the user and the implementation designer with respect to the e-mail message indicating the opportunity to start reflection, and if both the user and the implementation designer send the e-mail of acknowledgement, the monitoring server 290 sets the date on which the e-mail has received in the result date with respect to the reflection starting date in the schedule file. In the next monitoring, if the newest reflection starting date is before the monitoring execution date, and a date is written in the column of result date for the reflection starting date, the number of days for implementation designing is calculated based on the result date, to add a new reflection starting date. When this process is continued, the reflection starting date approaches the Sign Off date.

When the scheduled date for the reflection starting date is calculated, and when it exceeds the Sign Off date, the monitoring server 290 sends a message informing that the reflection starting date cannot be set, and the e-mail addresses of the user and the implementation designer to the mail server 260, and the mail server 260 transmits the e-mail to the user and the implementation designer.

When the user has sent an e-mail of rejection with respect to the message informing that it is the opportunity to start reflection, the Web client 100 sends a message to the user informing that scheduled date is set, sends e-mail addresses of the user and the implementation designer to the mail server 260, and the mail server 260 transmits the e-mail to the user and the implementation designer.

The schedule and result screen will be explained below. FIG. 37 is one example of the schedule and result screen. A logic Fix button and a change button in FIG. 37 are arranged near the newest reflection starting date, which is before the monitoring execution date by the monitoring server 290. When the user specifies the date in a date setting column below the button and presses the change button, the Web client 100 sends information indicating the set date and that change has been selected to the Web server 220. The status display interface program 224, having received the data from the Web server 220, changes the scheduled date for the newest reflection starting date in the schedule file to the specified date, and sends a message indicating the change, and the e-mail addresses of the user and the implementation designer to the mail server 260. The mail server 260 transmits the e-mail to the user and the implementation designer.

When the logic Fix button in FIG. 37 is pressed the date is specified, the status display interface program 224 executes the same process as that of when the change button is selected, and then suspends monitoring by the monitoring server 290. In this manner, a short-term target for the user and the implementation designer becomes clear, and the precision of specifying the scheduled date for the change-starting date increases as the number of tries of the implementation designing increases. Thus, the user and the implementation designer get an opportunity to consider how to proceed. Consequently, the efficiency improves considerably.

As described above, in the second embodiment, based on a request of a user from the Web client 100, the ASIC logic synthesis program 253 performs logic synthesis of the ASIC, the FPGA logic synthesis program 254 performs logic synthesis of the FPGA, the logic synthesis interface program 222 displays the result of logic synthesis of the ASIC and the FPGA on the Web client 100, and the mail server 260 informs the user by an e-mail, of the start and the result of the ASIC and FPGA logic synthesis. Consequently, the user can execute logic synthesis at any time without providing an exclusive operator for the logic synthesis, can maintain uniform logic synthesis quality as if the logic synthesis is performed by the exclusive operator, and can receive information of start and result of the logic synthesis by the e-mail, thereby eliminating the necessity of regularly confirming the progress of logic synthesis with a computer.

According to the second embodiment, the ASIC logic CORE generator program 251 generates a netlist including only the port connection information of a plurality of functional blocks specified by a user from the functional blocks constituting the ASIC, in response to a user's request from the Web client 100, generates ROM data in which a programmable logic device circuit is recorded by fitting data of the logic synthesized functional block into the netlist created by the FPGA logic CORE generator program 252, so that the generation result of the ROM data generated by the logic CORE generating interface program 221 is displayed on a computer and informed to the user by an e-mail from the mail server 260. As a result, the user can save load, time and cost required for generating the ROM data on which the programmable logic device circuit is recorded, without providing a development environment exclusively for the programmable logic device.

According to the second embodiment, when designing of the functional block constituting the ASIC specified by a user has not yet been completed and there is no circuit data, the FPGA logic CORE generator program 252 creates a netlist with a circuit in which a temporary flip-flop or the like is used for the input and output terminals of the functional block inserted therein. As a result, in the verification by prototyping of the programmable logic device, even if designing of the functional block, which is not a target of verification, has not yet been completed, verification by prototyping can proceed, thereby improving the efficiency of verification.

According to the second embodiment, when the monitoring server 290 monitors the scale of change between the latest circuit data held by the user and the circuit data incorporated into the implementation designing by the implementation designer, and if the planned date has approached based on the monitoring result and the time required for layout design, the mail server 260 informs the user and the ASIC implementation designer by an e-mail that it is time for reflecting the change in the ASIC implementation design, and in response to this information, the user requests suspension by changing the date for reflection. Consequently, the generated change can be efficiently reflected in layout designing of the ASIC. By setting the timing for reflecting the change, the user can determine until when the change can be made, and can review the schedule at an early stage.

As explained above, the following effects due to the present invention can be achieved.

According to the invention of one aspect, in a program storage medium that stores a program for making a computer execute a method of generating a core (logic core), the quality of port specification of a block, being an input in the RTL design, is ensured beforehand in the integrated circuit development. Further, in a large-scale integrated circuit having many functional blocks and design resources, because connection between blocks can be confirmed beforehand, it can be ensured that a chip is assembled without fail.

According to the invention of another aspect, a core (logic core) of the programmable logic device is allocated from the ASIC core (logic core), while maintaining connection between blocks. Therefore, if verification of the programmable logic device using the core (logic core) is performed, duplication of verification at least in the same configuration can be avoided in the ASIC. Thus, concurrent development of the ASIC and the programmable logic device can proceed efficiently.

When inserting the I/O buffer, the chip port information defined in the block and the chip terminal information can be cross-checked by a unit that generates a temporary core (logic core) from the chip terminal information, and replaces it by a core (logic core) generated from the block, thereby ensuring the quality of the port specification of the block and the chip terminal specification.

According to the invention of still another aspect, a netlist including ports of blocks of optional size and number and port connection information can be created.

According to the invention of still another aspect, a chip netlist can be created from the netlist including ports of blocks of optional size and number and port connection information.

According to the invention of still another aspect, in a recording medium that stores a program for making a logic synthesis tool execute a method of generating a core (logic core) of the programmable logic device, a decrease in efficiency of debugging such as logic verification can be prevented when a net name, from which it is difficult to determine the function of a port, becomes a port name.

Thus, the circuit architecture can be shared by generating a core (logic core) from the design document data and newly generating a core (logic core) for the programmable logic device from the core (logic core), with the hierarchical structure and the connection information being preserved. The circuit data and the net between instances, which do not depend on the device technology in the instance in which circuit data is inserted therein and function verification has been performed, can avoid re-verification when the ASIC is formed. Further, this avoids redesigning due to a difference between the ASIC and the programmable logic device.

According to the present invention, a development method of integrated circuits that realizes sharing of the architecture and that can avoid redesign and re-verification as much as possible, and a programmable storage medium storing the development method is provided.

According to the present invention, the functional blocks constituting the ASIC are grouped based on the port connection information, and a netlist including the ports of the grouped functional blocks and the port connection information is created as a core (logic core) of the programmable logic device. The ASIC logic synthesis data and the logic synthesis data for the programmable logic device are created from the circuit data of the functional blocks constituting the ASIC. The logic synthesis data for the programmable logic device relating to the grouped functional blocks is inserted in the created netlist to create ROM data for evaluating the real machine in which the circuit of the programmable logic device is recorded. Layout creation of the ASIC and the timing verification are performed concurrently with creation of the ROM data for evaluating the real machine using the created logic synthesis data for the ASIC. A change in the circuit data based on the evaluation result of the real machine using the created ROM data is reflected in creation of ASIC layout and timing verification. Consequently, efficient concurrent development of the ASIC and the programmable logic device becomes efficient, thereby reducing the development period of the ASIC.

According to the present invention, the functional blocks constituting the ASIC are grouped based on the port connection information, and a netlist including the ports of the grouped functional blocks and the port connection information is created as a core (logic core) of the programmable logic device. The ASIC logic synthesis data and the logic synthesis data for the programmable logic device are created from the circuit data of the functional blocks constituting the ASIC. The logic synthesis data for the programmable logic device relating to the grouped functional blocks is inserted in the created netlist to create ROM data for evaluating the real machine in which the circuit of the programmable logic device is recorded. Layout creation of the ASIC and the timing verification are performed concurrently with creation of the ROM data for evaluating the real machine using the created logic synthesis data for the ASIC. Consequently, concurrent development of the ASIC and the programmable logic device becomes efficient, thereby reducing the development period of the ASIC.

According to the present invention, logic synthesis of the ASIC is executed in response to a user's request, it is determined whether the logic synthesis result of the formed ASIC satisfies the speed performance requested by the user. Logic synthesis of the programmable logic device is executed based on the determination result. The execution result of logic synthesis of the ASIC and the execution result of logic synthesis of the programmable logic device are displayed on a computer, and an e-mail informing execution start and execution result of logic synthesis of the ASIC, and execution start and execution result of logic synthesis of the programmable logic device is sent to the user. Consequently, the user can execute logic synthesis at any time without providing an exclusive operator for the logic synthesis, can maintain uniform logic synthesis quality as if the logic synthesis is performed by the exclusive operator, and can receive information of start and result of the logic synthesis by the e-mail, thereby eliminating the necessity of regularly confirming the progress of logic synthesis by a computer.

According to the present invention, a netlist including the port connection information of a plurality of functional blocks specified by a user from the functional blocks constituting the ASIC is created in response to a user's request. ROM data in which a programmable logic device circuit is recorded is generated by inserting data of the logic synthesized functional block in the created netlist, and the generation result of the generated ROM data is displayed on a computer, and informed to the user by an e-mail. Consequently, the user can save load, time and cost required for generating the ROM data in which the programmable logic device circuit is recorded, without providing a development environment exclusively for the programmable logic device.

According to the present invention, when designing of the functional block constituting the ASIC specified by a user has not yet been completed and there is no circuit data, a netlist with a circuit in which a temporary flip-flop or the like is used for the input and output terminals of the functional block inserted therein is created. Consequently, in the verification by prototyping of the programmable logic device, even if designing of the functional block, which is not a target of verification, has not yet been completed, verification by prototyping can proceed, thereby improving the efficiency of verification.

According to the present invention, when the scale of change between the latest circuit data held by the user and the circuit data incorporated into the implementation designing by the implementation designer is monitored, and approaches the planned date based on the monitoring result and the time required for layout design, the user and the ASIC implementation designer are informed by an e-mail of the change and that it is time for reflecting the change in the ASIC implementation design. In response to this information, the user requests suspension by changing the date for reflection. Thus, the generated change is reflected efficiently in layout designing of the ASIC. By setting the timing for reflecting the change, the user can determine until when the change can be made, and can review the schedule at an early stage.

Further, according to the present invention, to create a netlist for the FPGA and the ASIC, on the one hand, FPGA design information is created in which the same terminals in a first design and a second design are connected, and a buffer corresponding to the FPGA is inserted between the terminals, from the first design in which terminal information of the FPGA including the whole or a part of functional blocks of a plurality of functional blocks is described, and the second design in which the same terminal information as that of the FPGA described as a low-order layer of the first design is described, and on the other hand, ASIC design information is created in which the same terminals in a third design and a fourth design are connected, and a buffer corresponding to the ASIC is inserted between the terminals, from the third design in which terminal information of the ASIC including the functional blocks is described, and the fourth design in which the same terminal information as that of the ASIC described as a low-order layer of the third design is described. This is followed by replacing each of the second design and the fourth design by the circuit information created based on the connection information of the functional blocks included in each design. Consequently, efficient concurrent development of the ASIC and the programmable logic device becomes possible, thereby reducing the development period of the ASIC.

INDUSTRIAL APPLICABILITY

As described above, the development method of integrated circuits, the program storage medium storing the development method of integrated circuits, and the concurrent development system, concurrent development program, and concurrent development method of the ASIC and the programmable logic device according to the present invention are suitable for development of integrated circuits, and particularly suitable for development of the ASIC and the programmable logic device.

The invention claimed is:
1. A concurrent development system for concurrent development of an ASIC and a programmable logic device used by a user from a computer connected to a network, comprising:
an ASIC logic synthesis unit that executes logic synthesis of the ASIC in response to a request from the user, to obtain a first logic synthesis result;
an ASIC logic synthesis result determining unit that determines whether the first logic synthesis result satisfies a speed performance required by the user, to obtain a determination result;
a programmable logic device logic synthesis unit that executes logic synthesis of the programmable logic device, based on the determination result to obtain a second logic synthesis result;
a logic synthesis result displaying unit that displays the first logic synthesis result and the second logic synthesis result on the computer; and
a logic synthesis informing unit that informs the user by an e-mail, of start of the logic synthesis of the ASIC and the first logic synthesis result, and of start of the logic synthesis of the programmable logic device and the second logic synthesis result.

2. The concurrent development system for concurrent development of an ASIC and a programmable logic device according to claim 1, further comprising:

- a netlist creating unit that creates a netlist including port connection information of a plurality of functional blocks specified by the user, from functional blocks constituting the ASIC, in response to a request of the user;
- a ROM data creating unit that creates ROM data, in which a circuit of the programmable logic device is recorded, by inserting logic synthesized data of the plurality of functional blocks into the netlist created by the netlist creating unit;
- a ROM data creation result display unit that displays a result of the creation of the ROM data, on the computer; and
- a ROM data creation result informing unit that informs the user by an e-mail, of the result of creation of the ROM data.

3. The concurrent development system for concurrent development of an ASIC and a programmable logic device according to claim 2, further comprising:

- a temporary netlist creating unit that creates a netlist in which a dummy circuit is inserted in an input terminal and an output terminal of the functional block constituting the ASIC specified by the user, when designing of the functional block has not been completed, and when there is no circuit data.

4. The concurrent development system for concurrent development of an ASIC and a programmable logic device according to claim 1, further comprising:

- a monitoring unit that monitors the latest circuit data the user has and the scale of change in the circuit data incorporated in an implementation design by an implementation designer, to thereby obtain a monitoring result;
- a change timing informing unit that informs the user and the implementation designer of the ASIC by an e-mail that it is time to reflect the change monitored, based on the monitoring result and the time required for the layout designing, at a scheduled date and time; and
- a reflection suspension requesting unit using which the user requests suspension of reflecting the change monitored, by altering the date for reflecting the change monitored, in response to the e-mail.

5. A concurrent development method for concurrent development of an ASIC and a programmable logic device used by a user from a computer connected to a network, comprising:

- a first executing including executing, by using a computer, logic synthesis of the ASIC in response to a request from the user, to obtain a first logic synthesis result;
- determining whether the first logic synthesis result satisfies a speed performance required by the user, to obtain a determination result;
- a second executing including executing logic synthesis of the programmable logic device, based on the determination result to obtain a second logic synthesis result;
- displaying the first logic synthesis result and the second logic synthesis result on the computer; and
- informing the user by an e-mail, of start of the first executing and the first logic synthesis result, and of start of the second executing and the second logic synthesis result.

* * * * *

UNITED STATES PATENT AND TRADEMARK OFFICE
CERTIFICATE OF CORRECTION

PATENT NO.        : 8,225,243 B2
APPLICATION NO.   : 12/591356
DATED             : July 17, 2012
INVENTOR(S)       : Chiaki Koga et al.

It is certified that error appears in the above-identified patent and that said Letters Patent is hereby corrected as shown below:

First Page Col. 2 (Other Publications), Line 3, delete "Kokoku," and insert -- Hokoku, --, therefor.
First Page Col. 2 (Abstract) Line 12, delete "gerate" and insert -- generate --, therefor.
Column 1, Line 16, After "and" delete "now allowed,".

Signed and Sealed this
Second Day of October, 2012

David J. Kappos
*Director of the United States Patent and Trademark Office*